US008021809B2

(12) United States Patent
Van Dijk

(10) Patent No.: US 8,021,809 B2
(45) Date of Patent: Sep. 20, 2011

(54) DEVICE MANUFACTURING METHOD, LITHOGRAPHIC SYSTEM, LITHOGRAPHIC APPARATUS AND DESIGN FOR MANUFACTURING SYSTEM

(75) Inventor: Adrianus Cornelis Johannes Van Dijk, Tremelo (BE)

(73) Assignee: ASML Netherlands B.V., Veldhoven (NL)

( * ) Notice: Subject to any disclaimer, the term of this patent is extended or adjusted under 35 U.S.C. 154(b) by 274 days.

(21) Appl. No.: 12/345,097

(22) Filed: Dec. 29, 2008

(65) Prior Publication Data

US 2009/0220871 A1 Sep. 3, 2009

Related U.S. Application Data

(60) Provisional application No. 61/009,205, filed on Dec. 27, 2007.

(51) Int. Cl.
*G03C 5/00* (2006.01)
*G03B 27/32* (2006.01)
*G03B 27/42* (2006.01)
*G03B 27/54* (2006.01)

(52) U.S. Cl. ............................ 430/30; 355/67; 355/77

(58) Field of Classification Search .................. 430/30; 355/67, 77
See application file for complete search history.

(56) References Cited

U.S. PATENT DOCUMENTS

| 5,815,685 | A | 9/1998 | Kamon |
| 6,883,158 | B1 | 4/2005 | Sandstrom et al. |
| 7,113,256 | B2 | 9/2006 | Butler et al. |
| 7,233,386 | B2 | 6/2007 | Reisinger et al. |
| 2005/0028129 | A1 | 2/2005 | Hsu et al. |

FOREIGN PATENT DOCUMENTS

| JP | 08-297692 A | 11/1996 |
| JP | 2003-500847 A | 1/2003 |
| JP | 2004-235460 A | 8/2004 |
| JP | 2005-236296 A | 9/2005 |
| JP | 2005-303303 A | 10/2005 |
| JP | 2006-210814 A | 8/2006 |

OTHER PUBLICATIONS

English language Abstract of Japanese Patent Publication No. 08-297692 A, published Nov. 12, 1996; 1 page.
English language Abstract of Japanese Patent Publication No. 2004-235460 A, published Aug. 19, 2004; 1 page.
English language Abstract of Japanese Patent Publication No. 2005-236296 A, published Sep. 2, 2005; 1 page.
English language Abstract of Japanese Patent Publication No. 2005-303303 A, published Oct. 27, 2005; 1 page.
English language Abstract of Japanese Patent Publication No. 2006-210814 A, published Aug. 10, 2006; 1 page.
English translation of Japanese Notice of Reasons for Rejection directed to related Japanese Application No. 2008-323087, the Japanese Patent Office, mailed Jun. 16, 2011; 3 pages.
Cai, L., et al., "Model Accuracy Requirements for Lithography-Aware Design Verification," Brion Technologies, Inc., Santa Clara, California; 9 pages.
Liebmann, L., et al., "Integrating DfM Components Into a Cohesive Design-To-Silicon Solution," *Proceedings of SPIE vol. 5756:*1-12, Design and Process Integration for Microelectronic Manufacturing III (2005).

*Primary Examiner* — Christopher Young
(74) *Attorney, Agent, or Firm* — Sterne, Kessler, Goldstein & Fox P.L.L.C.

(57) ABSTRACT

In an embodiment, a device manufacturing method for transferring a pattern from a patterning device onto a substrate includes receiving a design layout information associated with a device, determining the pattern from the design layout information, providing the pattern to a patterning device, determining feed-forward requirement data from the design layout information, wherein the feed-forward requirement data includes at least first feed-forward requirement data related to a first location in the pattern and second feed-forward requirement data related to a second location in the pattern, determining a transfer condition from at least at least the first and the second feed-forward requirement data; and transferring a portion of the pattern from the patterning device onto the substrate based at least in part on the transfer condition.

13 Claims, 17 Drawing Sheets

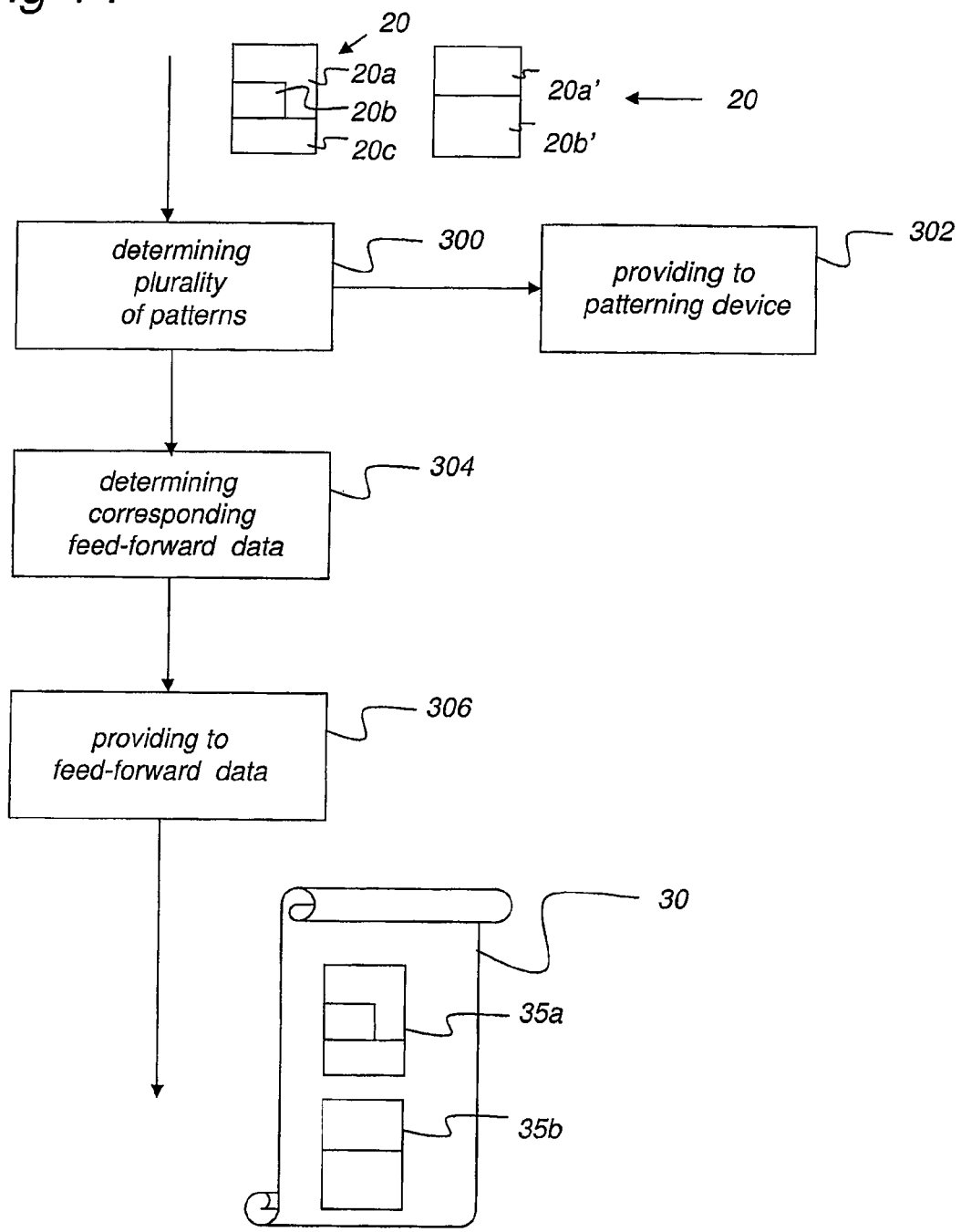

DEVICE MANUFACTURING METHOD, LITHOGRAPHIC SYSTEM, LITHOGRAPHIC APPARATUS AND DESIGN FOR MANUFACTURING SYSTEM

CROSS-REFERENCE TO RELATED APPLICATIONS

The present application claims the benefit of U.S. Provisional Patent Appl. No. 61/009,205, filed Dec. 27, 2007, which is incorporated by reference herein in its entirety.

BACKGROUND

1. Field

Embodiments of the present invention relate to a method for manufacturing a device, a lithographic apparatus, a design for manufacturing system, a computer program product for use with a lithographic apparatus and a computer program product for use with a design for manufacturing system.

2. Background

A lithographic apparatus is a machine that applies a desired pattern onto a substrate, usually onto a target portion of the substrate. A lithographic apparatus can be used, for example, in the manufacture of devices such as integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

U.S. Pat. Appl. Publ. No. 2005/028129 A1, incorporated herein by reference in its entirety, describes a method to automatically determine beam condition parameters from a target layout. In particular, to determine a numerical aperture (NA) of the radiation beam and an intensity distribution of the radiation in a pupil of the optical system of the lithographic apparatus, such as the sigma_inner and sigma_outer of an annular pupil filling. U.S. Pat. Appl. Publ. No. 2005/028129 A1 uses e.g. a line width analysis or pitch analysis to determine NA and sigma_inner and sigma_outer such that the features may be printed without bias adjustments.

Although the method described in U.S. Pat. Appl. Publ. No. 2005/028129 A1 provides an improvement over earlier prior art methods by effectively adjusting the optical system so as to achieve an imaging with an optimal resolution, the method may still give rise to some problems. For example, when a large NA is selected with a large pupil filling, the depth of focus of the imaging is very small and the risk of not being in optimal focus may be significant. When the imaging is done without having optimal focus, the imaging resolution may be of a lesser quality and the highest resolution features may be imaged with a too low quality.

SUMMARY

The inventors have invented a device manufacturing method and a lithographic apparatus which overcomes or mitigates one or more shortcomings of the apparatus described in the prior art. In particular, it is desirable to provide a device manufacturing method and a lithographic apparatus which has an improved imaging quality performance.

According to an aspect of the invention, there is provided a device manufacturing method including transferring a pattern from a patterning device onto a substrate, wherein the method includes receiving a design layout information associated with a device, determining the pattern from the design layout information, providing the pattern to a patterning device, determining feed-forward requirement data from the design layout information, wherein the feed-forward requirement data includes at least first feed-forward requirement data related to a first location in the pattern and second feed-forward requirement data related to a second location in the pattern, determining a transfer condition from at least at least the first and the second feed-forward requirement data, and transferring a portion of the pattern from the patterning device onto the substrate in dependence on the transfer condition.

The transferring this results in a transferred pattern on the substrate which corresponds to the intended design, as the transfer condition is determined in dependence of the feed-forward requirement data associated with the intended design.

Determining the first and second feed-forward requirement data from the design layout information may, e.g., include analyzing the features in a layer in the device related to the design layout information present in the pattern being transferred from the patterning device onto the substrate.

Determining the first and second feed-forward requirement data from the design layout information may also, e.g. relate to the features in the layer in the device related to the design layout information present in the pattern being transferred onto the substrate in relation to features already present on the substrate, such as alignment marks or features from a layer in the device related to the design layout information present in the pattern having been transferred in an earlier transfer from an earlier patterning device relating to another layer of the device onto the substrate. Such feed-forward requirement data includes e.g. an overlay requirement and an alignment mark position.

According to an aspect of the invention, there is provided a lithographic system arranged and construed for receiving a design layout information associated with a device, determining a pattern from the design layout information, determining feed-forward requirement data from the design layout information, wherein the feed-forward requirement data includes at least first feed-forward requirement data related to a first location in the pattern and second feed-forward requirement data related to a second location in the pattern, providing the pattern to a patterning device, determining a transfer condition from at least the first and the second feed-forward requirement data, and transferring a portion of the pattern from the patterning device onto a substrate in dependence on the transfer condition.

According to an aspect of the invention, there is provided a lithographic apparatus including: an illumination system configured to condition a radiation beam with a radiation beam condition; a support constructed to support a patterning device, the patterning device being capable of imparting the radiation beam with a pattern in its cross-section to form a patterned radiation beam; a projection system configured to project the patterned radiation beam onto a target portion of a substrate with a projection beam condition; a positioner configured to position the patterning device relative to the substrate with a position condition; and a controller configured to control at least one condition selected from the group consisting of the radiation beam condition, the projection beam condition and the position condition with at least a transfer condition, wherein the controller is configured for receiving feed-forward requirement data, the feed-forward requirement data being associated with the pattern of the patterning device and including at least first feed-forward requirement data related to a first location in the pattern and second feed-forward requirement data related to a second location in the pattern, and determining the transfer condition from at least the feed-forward requirement data.

The lithographic apparatus may thus determine the optimal transfer condition associated with transferring a specific portion of the pattern to the substrate, based on the feed-forward requirement data provided to the lithographic apparatus.

According to an aspect of the invention, there is provided a design for a manufacturing system including a processor, the processor being configured to receive a design layout information associated with a device and determine feed-forward requirement data from the design layout information, the feed-forward requirement data being suitable to be provided to a lithographic apparatus.

The design for a manufacturing system may thus determine the feed-forward requirement data from the design layout information for e.g. allowing a lithographic apparatus to automatically determine the optimal transfer condition associated with transferring a specific portion of the pattern to the substrate. Part of the feed-forward requirement data may also be used by an operator of a lithographic apparatus to manually set parameters relating to the operation of the lithographic apparatus, or, e.g. to qualify the pattern, the substrate or a specific portion of the pattern to the substrate or the substrate for off-line inspection.

The design for manufacturing system may be a dedicated apparatus, or be implemented in a computer system including a programmable processor.

According to an aspect of the invention, there is provided a lithographic apparatus arranged to transfer with a transfer condition a pattern from a patterning device onto a substrate, wherein the lithographic apparatus is configured to receive feed-forward requirement data, the feed-forward requirement data being associated with the pattern from the patterning device, and determine the transfer condition from the feed-forward requirement data.

According to an aspect of the invention, there is provided a computer program product including instructions and data to allow a processor to run a predetermined program in accordance with a method as described above.

The computer program product may include instructions to determine the feed-forward data associated with the pattern from the design layout information. The computer program product may additionally include instructions to the pattern for the patterning device from the design layout information. In determining the pattern from the design layout information, the computer program product may further include instructions for modifying the pattern for the patterning device by adding auxiliary marks, such as alignment marks, and by modifying e.g. line widths to achieve an intended structure on the substrate and/or correcting for bias effects.

The computer program product may include instructions to determine the transfer condition from the feed-forward data.

According to an aspect of the invention, there is provided a computer program product on a medium readable by a processor, the processor being associated with a lithographic apparatus arranged and construed for transferring a pattern from a patterning device onto a substrate in dependence on a transfer condition, the computer program, when loaded in the processor, causing the processor to perform a method including receiving feed-forward requirement data, the feed-forward requirement data being associated with the pattern of the patterning device and including at least first feed-forward requirement data related to a first location in the pattern and second feed-forward requirement data related to a second location in the pattern, and determining the transfer condition from at least feed-forward requirement data.

According to an aspect of the invention, there is provided a computer program product on a medium readable by a processor, the processor being associated with design for manufacturing system arranged and construed for providing a pattern for a patterning device and feed-forward requirement data usable in a lithographic apparatus being arranged and construed transferring the pattern from the patterning device onto a substrate in dependence on a transfer condition determined from the feed-forward requirement data, and the computer program, when loaded in the processor, causing the processor to perform a method including receiving a design layout information associated with a device, and determining the feed-forward requirement data from the design layout information, the feed-forward requirement data being suitable to be provided to a lithographic apparatus.

According to an aspect of the invention, there is provided a computer-readable medium being provided with a feed-forward file, the feed-forward file including feed-forward requirement data, wherein the feed-forward requirement data includes at least first feed-forward requirement data related to a first location in the pattern and second feed-forward requirement data related to a second location in the pattern and the feed-forward requirement data is usable for determining a transfer condition.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 7 schematically depicts a substrate used with the lithographic apparatus according to an embodiment of the invention.

Figure 8:
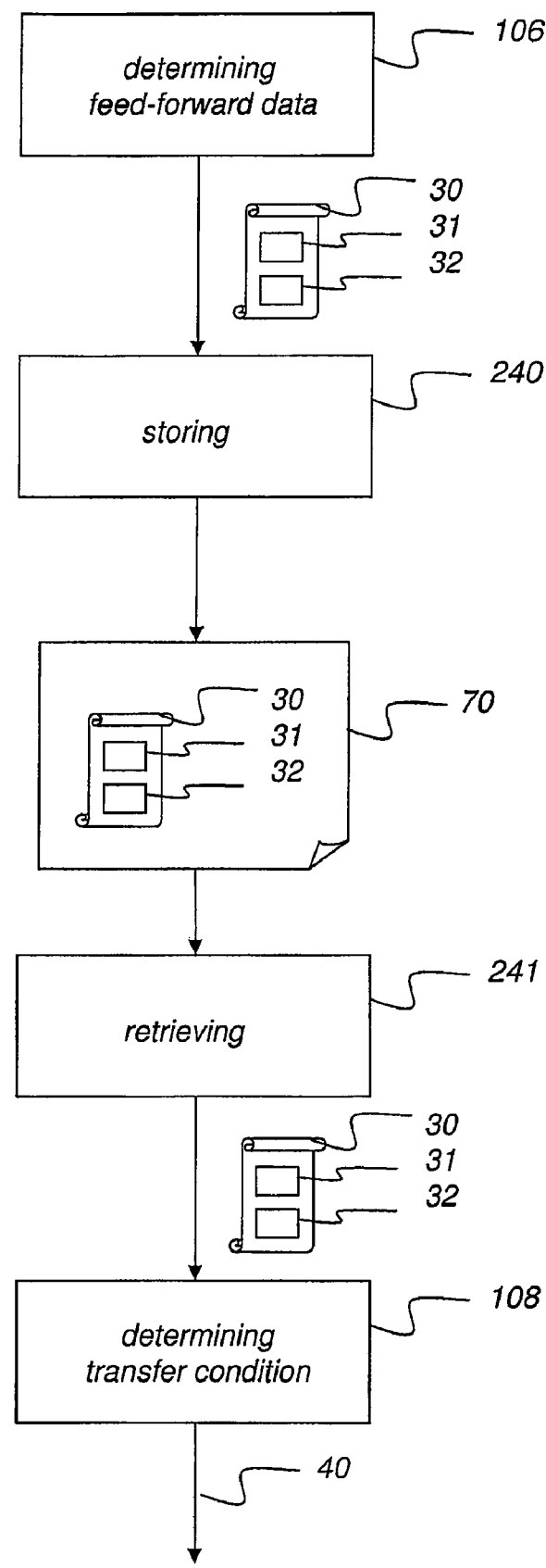

FIG. 8 depicts an aspect of a method according to an embodiment of the invention.

Figure 9:
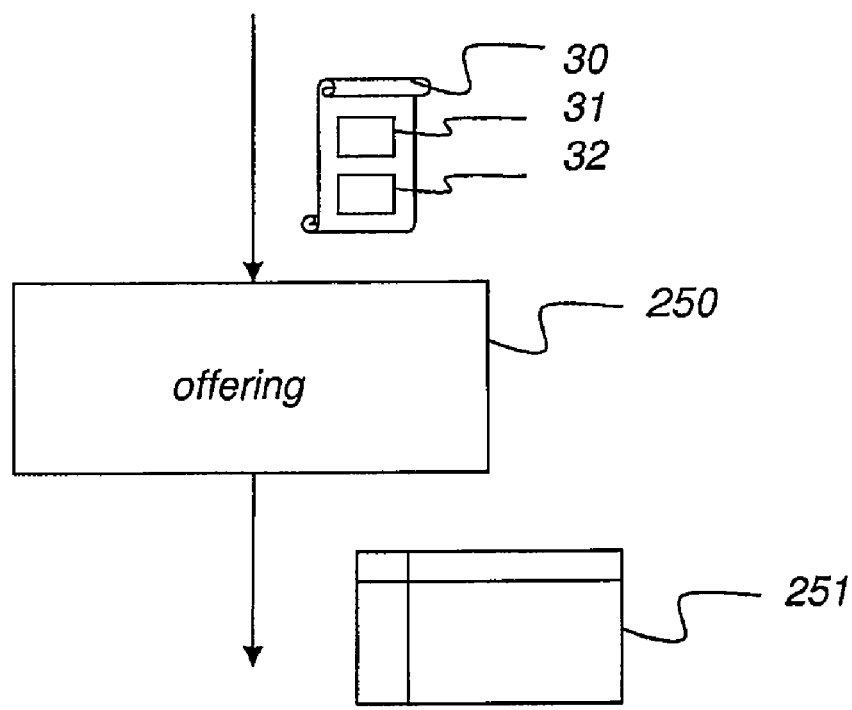

FIG. 9 depicts an aspect of a method according to an embodiment of the invention.

Figure 10:
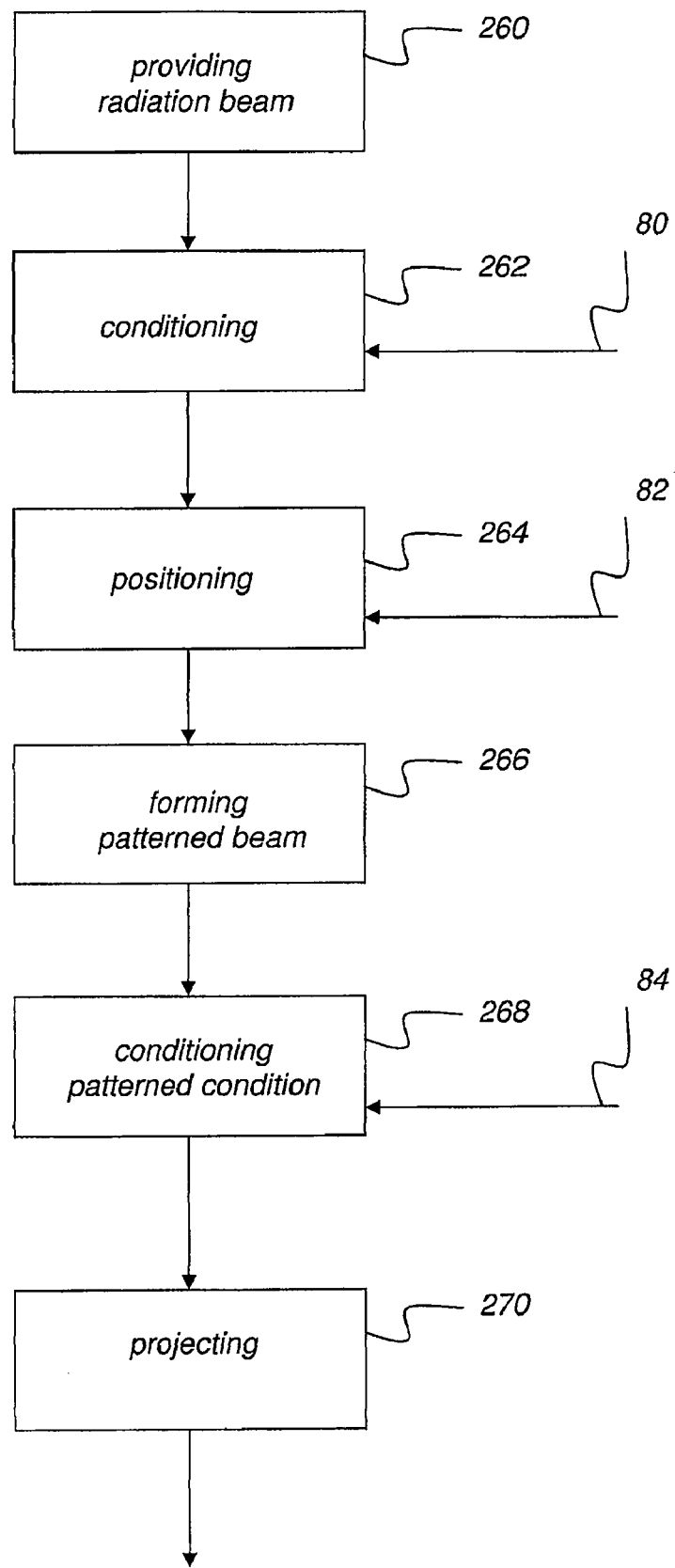

FIG. 10 depicts an aspect of a method according to an embodiment of the invention.

Figure 11:
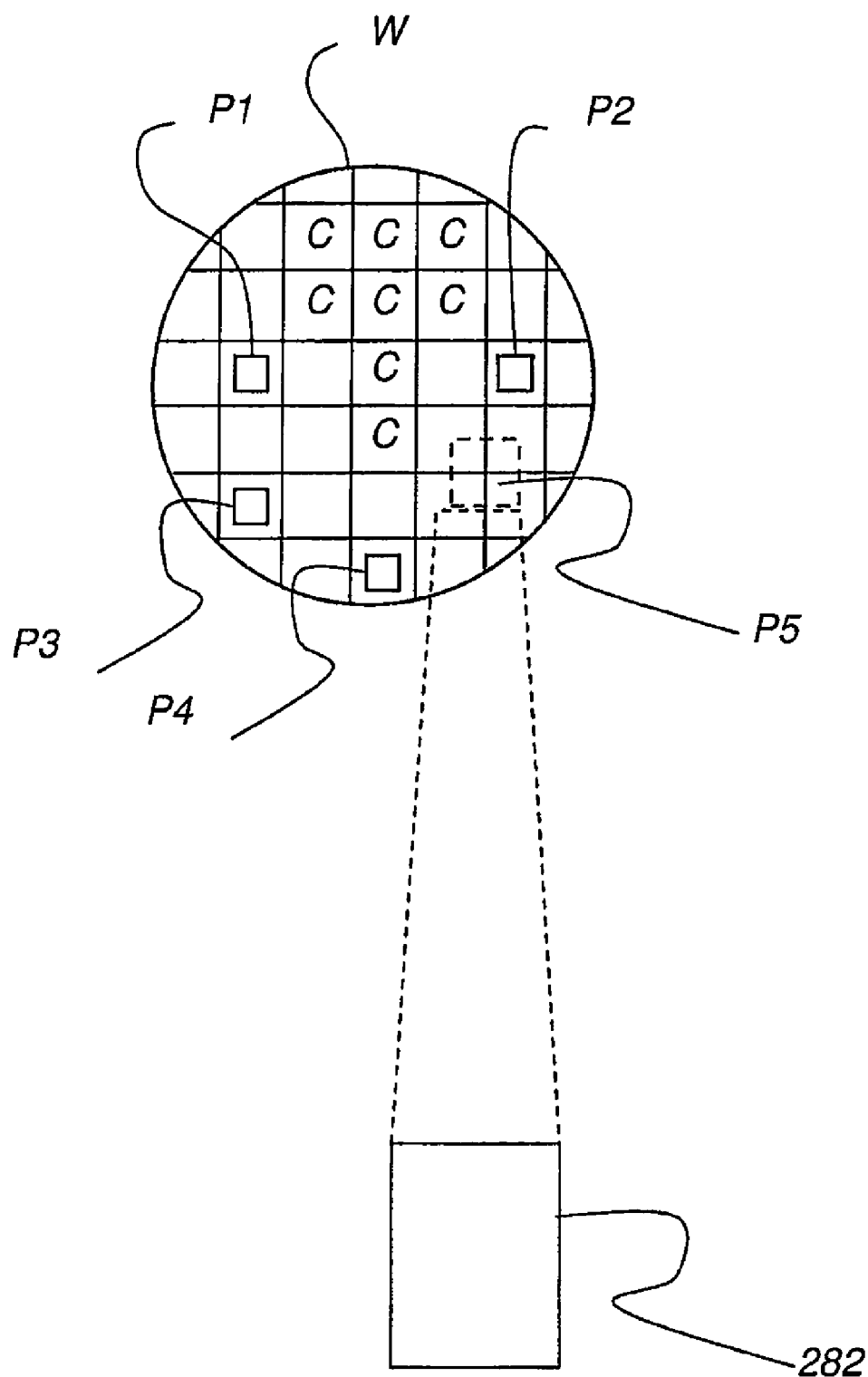

FIG. 11 depicts a substrate and an aspect of a method according to an embodiment of the invention.

Figure 12:
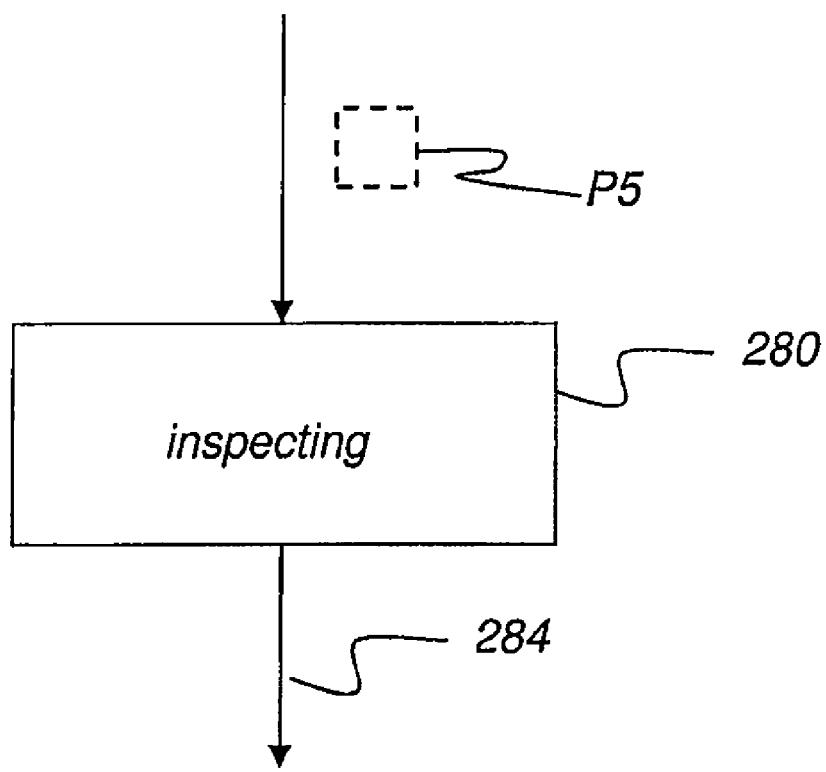

FIG. 12 depicts an aspect of a method according to an embodiment of the invention.

FIG. 13 depicts an aspect of a method according to an embodiment of the invention.

FIG. 14 depicts an aspect of a method according to an embodiment of the invention.

Figure 15:
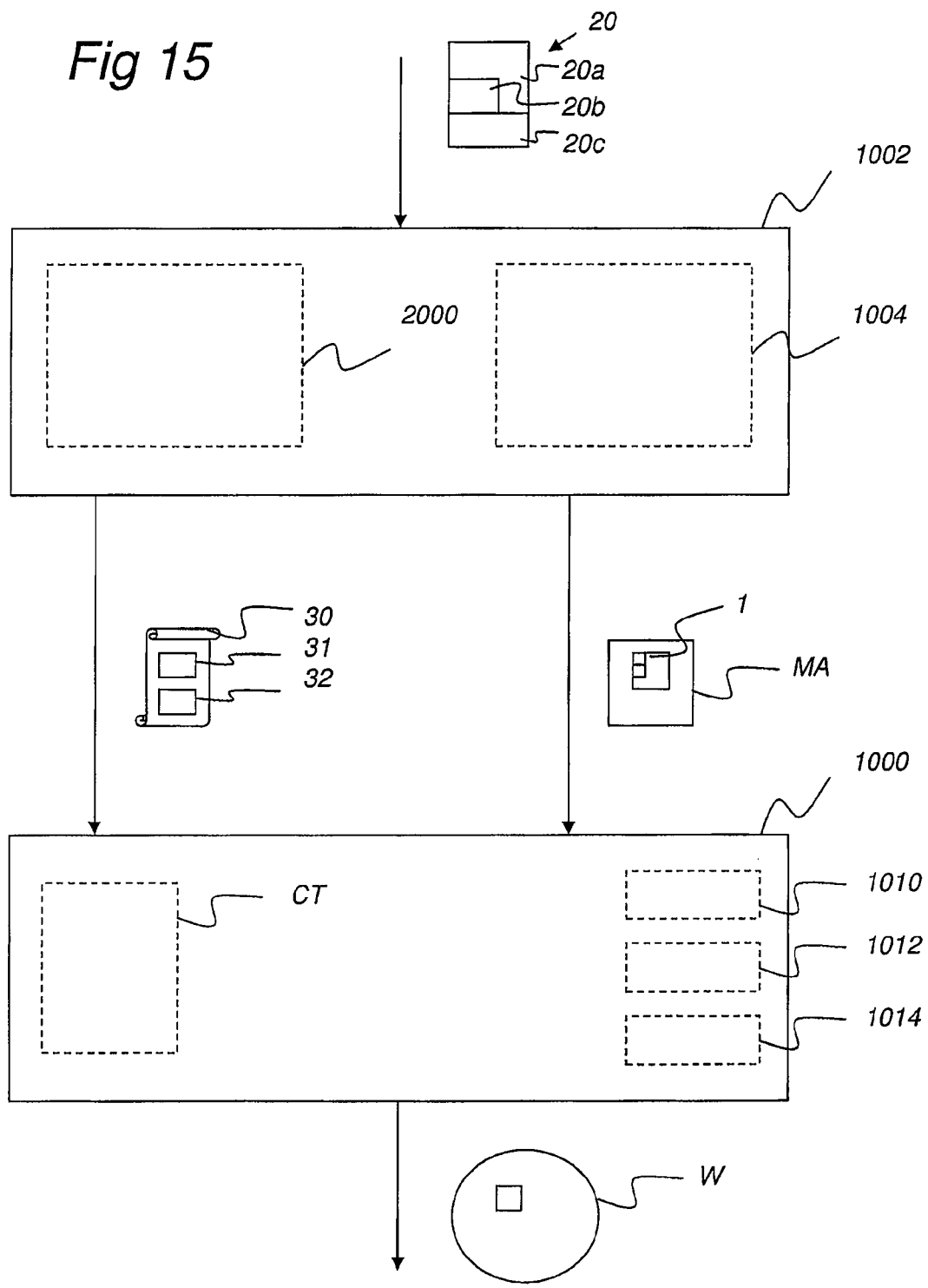

FIG. 15 depicts a lithographic system according to an embodiment of the invention.

FIG. 16 depicts an aspect of a method according to an embodiment of the invention.

Figure 17:
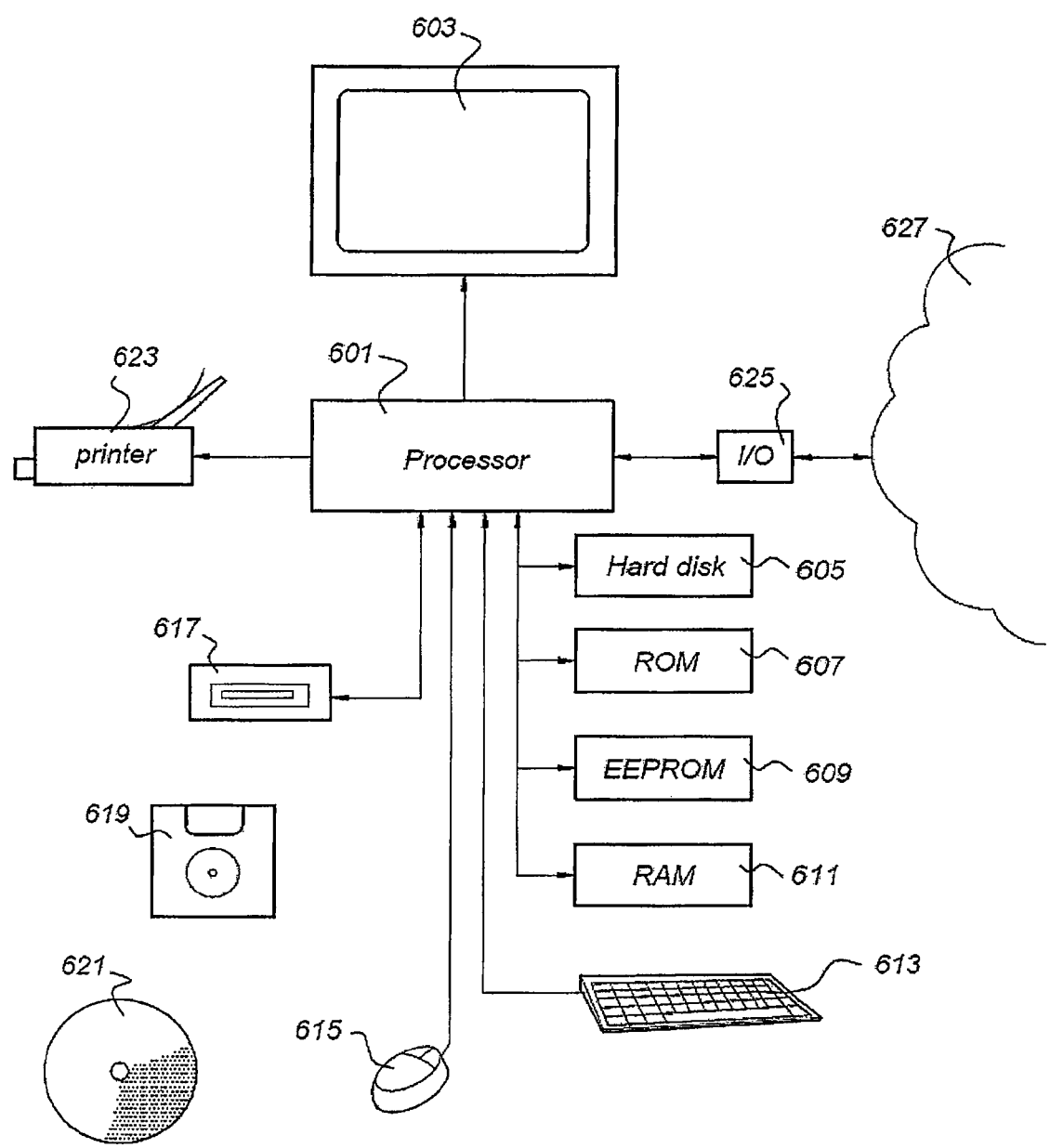

FIG. 17 depicts an overview of a computer arrangement that can be used to carry out the method according to the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1:
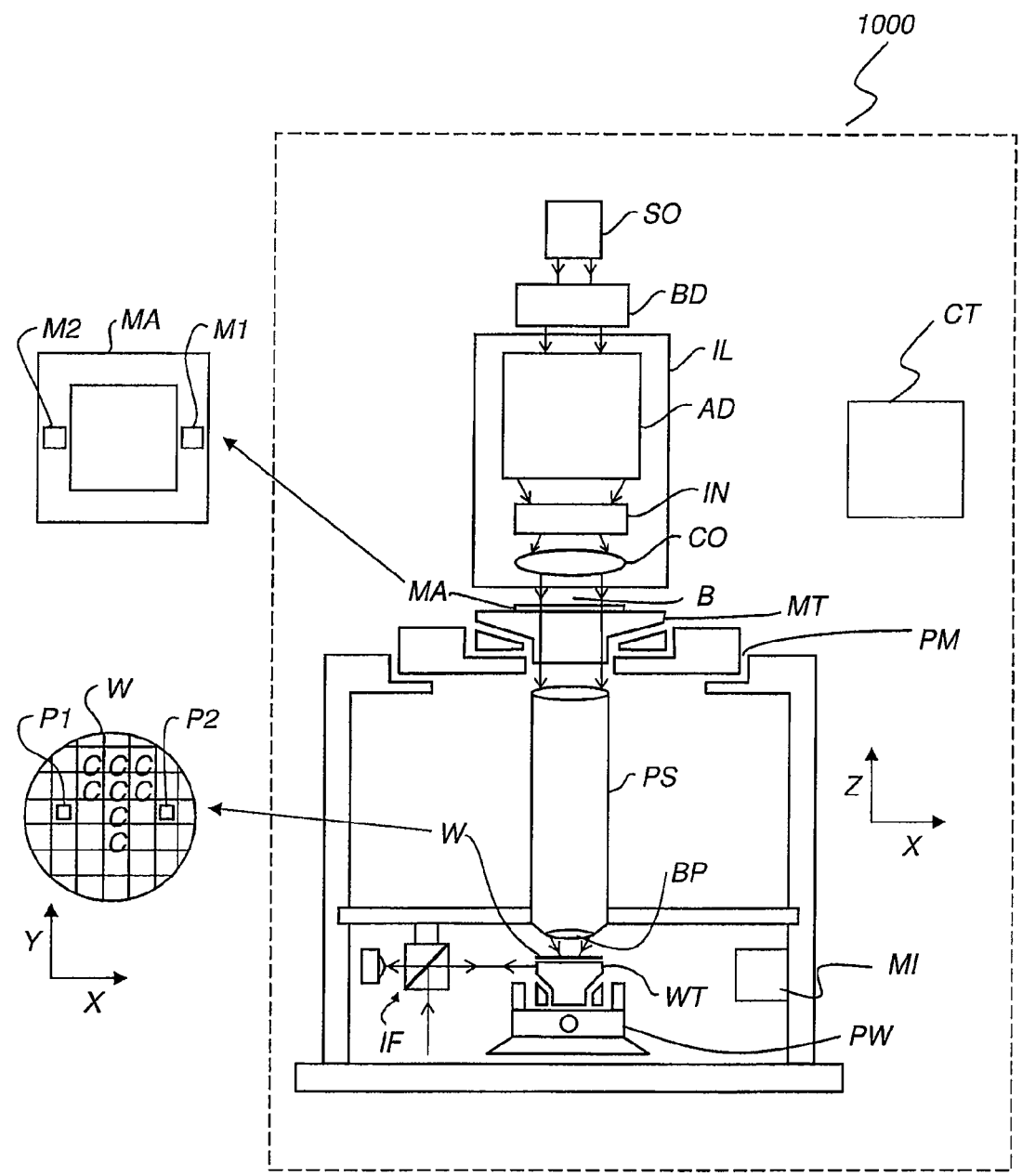
FIG. 1 depicts a lithographic apparatus according to an embodiment of the invention.

FIG. 1 schematically depicts a lithographic apparatus according to one embodiment of the invention. The apparatus includes:

- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to radiation beam B by patterning device MA onto a target portion C (e.g. including one or more dies) of substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system BD including, for example, suitable directing mirrors and/or a beam expander. In other cases the source may be an integral part of the lithographic apparatus, for example when the source is a mercury lamp. Source SO and illuminator IL, together with beam delivery system BD if required, may be referred to as a radiation system.

Illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may include various other components, such as an integrator IN and a condenser CO. The illuminator may be used to condition the radiation beam, to have a desired uniformity and intensity distribution in its cross-section.

Radiation beam B is incident on the patterning device (e.g., mask MA), which is held on the support structure (e.g., mask table MT), and is patterned by the patterning device. Having traversed mask MA, radiation beam B passes through projection system PS, which focuses the beam onto a target portion C of substrate W. With the aid of second positioner PW and position sensor IF (e.g. an interferometric device, linear encoder or capacitive sensor), substrate table WT can be moved accurately, e.g. so as to position different target portions C in the path of radiation beam B. Similarly, first positioner PM and another position sensor (which is not explicitly depicted in FIG. 1) can be used to accurately position mask MA with respect to the path of radiation beam B, e.g. after mechanical retrieval from a mask library, or during a scan. In general, movement of mask table MT may be realized with the aid of a long-stroke module (coarse positioning) and a short-stroke module (fine positioning), which form part of first positioner PM. Similarly, movement of substrate table WT may be realized using a long-stroke module and a short-stroke module, which form part of second positioner PW. In the case of a stepper (as opposed to a scanner) mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on mask MA, the mask alignment marks may be located between the dies.

A measurement instrument MI may includes a leveling sensor, a beam quality sensor or any other measurement tool providing information usable for controlling one or more elements of the lithographic apparatus.

A controller CT is operable to control radiation source SO, adjuster AD, first positioner PM, second positioner PW, the operation of position sensor IF, measurement instrument MI, and any one or more controllable elements of the lithographic apparatus.

The depicted apparatus could be used in at least one of the following modes:

1. In step mode, mask table MT and substrate table WT are kept essentially stationary, while an entire pattern imparted to the radiation beam is projected onto a target portion C at one time (i.e. a single static exposure). Substrate table WT is then shifted in the X and/or Y direction so that a different target portion C can be exposed. In step mode, the maximum size of the exposure field limits the size of the target portion C imaged in a single static exposure.

2. In scan mode, mask table MT and substrate table WT are scanned synchronously while a pattern imparted to the radiation beam is projected onto a target portion C (i.e. a single dynamic exposure). The velocity and direction of substrate table WT relative to mask table MT may be determined by the (de-)magnification and image reversal characteristics of projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, mask table MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
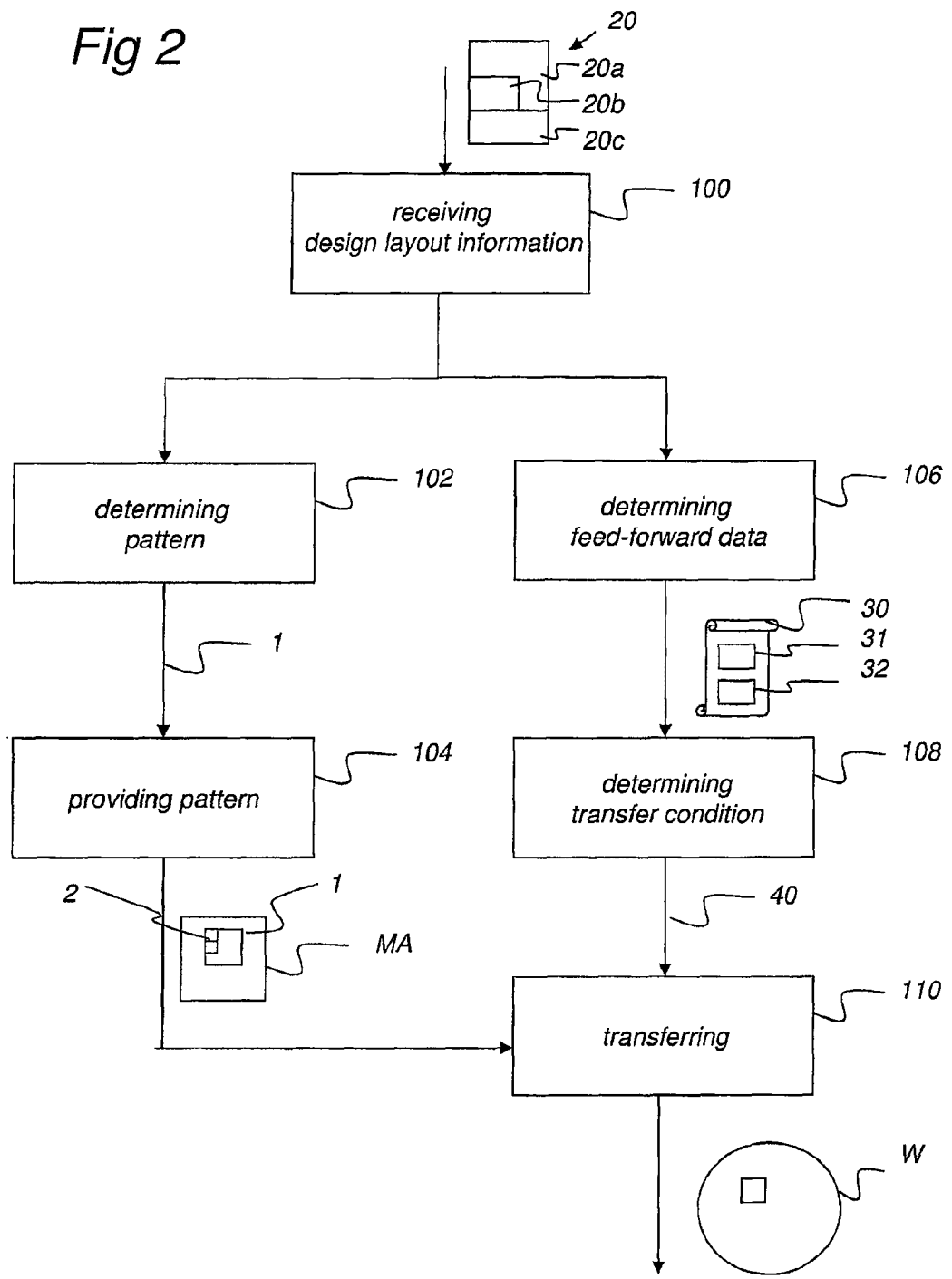
FIG. 2 depicts a method according to an embodiment of the invention.

FIG. 2 depicts a method according to an embodiment of the invention. The device manufacturing method for transferring a pattern 1 from a patterning device MA onto a substrate W, includes:

receiving 100 a design layout information 20 associated with a device;
determining 102 the pattern 1 from design layout information 20;
providing 104 the pattern 1 to a patterning device MA;
determining 106 feed-forward requirement data 30 from design layout information 20, wherein the feed-forward requirement data includes at least first feed-forward requirement data 31 related to a first location in the pattern and second feed-forward requirement data 32 related to a second location in the pattern;
determining 108 a transfer condition 40 from at least the first and the second feed-forward requirement data; and
transferring 110 a portion of the pattern 1 from patterning device MA onto substrate W in dependence on transfer condition 40.

The design layout information is provided from a design tool used by an IC designer or a team of IC designers. Such design tools may translate a schematic circuit diagram, listed e.g. as a set of a plurality of electrical components connected in a suitable configuration, or as a description in a more abstract programming language such as VHDL, into a design layout. As a phase in the design process, the IC designer may use e.g. a so-called place-and-route tool to place all functional devices at corresponding locations. As another phase in the design process, the IC designer will generate the design layout information including a plurality of layouts for a plurality of process steps. E.g., a first layout from the plurality of layouts may correspond to positions of gates of transistors, corresponding to narrow regions to be etched in a layer of an isolating material.

The IC designer has all the knowledge of the circuit, e.g. the function of specific blocks before transforming the functional device design into the design layout information, which would allow the designer to determine all settings for the lithographic machine, including the transfer conditions if the designer has a detailed knowledge of the possible configurations of the lithographic machine as well as the effect of further process steps, such as etching and polishing, on the substrate. The IC designer, however, typically does not have this detailed knowledge.

The design layout information is usually sent to an IC production foundry, in order to manufacture the IC. The IC production foundry has the task of manufacturing an IC according to the design layout information provided from the IC designer, i.e. to manufacture the IC as intended by the IC designer such that the IC will perform as intended. In determining the pattern from the design layout information and providing the pattern to a patterning device, the method may therefore further include adding features such as sub-resolution assist-features and alignment marks, for later use during transferring the portion of the pattern from the patterning device onto the substrate, or make modifications to the design such as line widths, so that with the modified patterning device critical structures are transferred on the substrate according to the intended device design. However, fine-tuning the implementation of these functions, possibly available as software options with a lithographic apparatus, per layer per device (IC) is very time consuming. Also very application-specific functions may be needed in order to achieve an optimal quality of the transferred pattern, e.g. when the device includes regions with a different topology resulting in a possibly unexpected and unwanted bias to e.g. focus signals or alignment signals, causing a deterioration of the transferring resolution or the alignment of a next layer on the substrate with respect to an earlier applied layer. Foundries are struggling to develop and implement these solutions. Foundries have to handle too many different products (with totally different patterning device designs), and they simply do not have the time and man power to evaluate per design whether a suitable software option is available and whether these software options should be implemented or not, nor do they have time to run experiments per device/per layer to optimize the software solution.

With the method according to an embodiment of the invention, the feed-forward requirement data determined from the design layout information allows a determination of the transfer condition from the feed-forward requirement data and incorporation of these solutions in determining the transfer condition, e.g. automatically or assisted with only limited effort by an operator in the foundry. The foundry does not need to know the actual functional design. Determining the feed-forward requirement data from the design layout information may be done together with determining the pattern from the design layout information, allowing to optimally balance the characteristics of the pattern, including the assist features and other modifications mentioned above, and the feed-forward requirement data. As an example, the feed-forward requirement data may include a position and a resolution indication of the assist feature, to allow to determine a transfer condition associated with using the assist feature, e.g. for alignment. As an example, the feed-forward requirement data may include a required imaging node, a required overlay control, and a required dose control.

As another example, the feed-forward requirement data may include a transition area between two areas in the device layout information and hence on the substrate with two different types of features, e.g. between pattern elements corresponding to the device (IC) to be manufactured and pattern elements corresponding to alignment marks inserted at determining the pattern from the design layout information and providing the pattern to a patterning device, or to a so-called scribe-lane between pattern elements corresponding to a first device (IC) and pattern elements corresponding to a second device or around pattern elements corresponding to a first device.

Further examples will be discussed in reference with detailed embodiments below.

Figure 3:
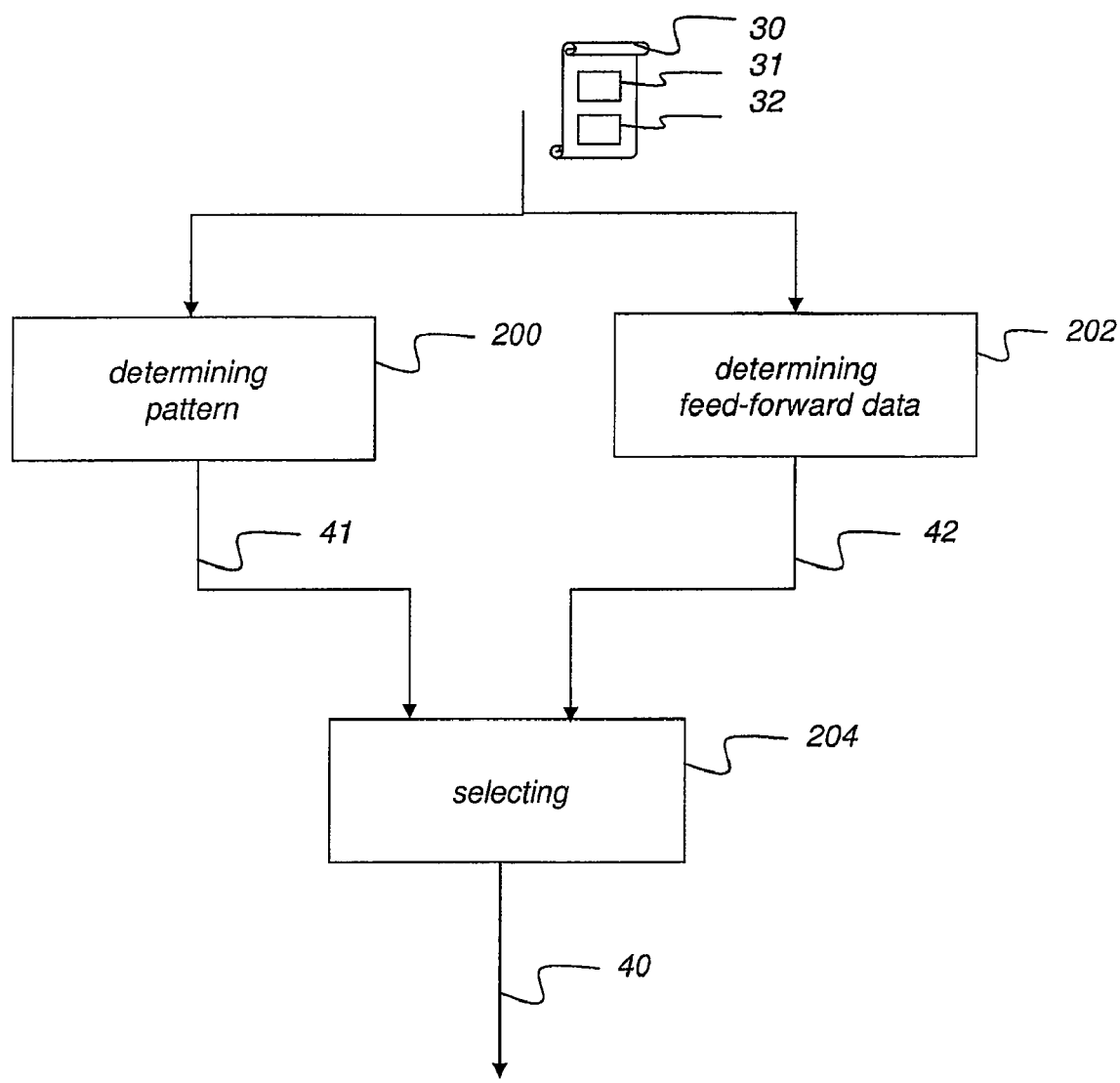
FIG. 3 depicts an aspect of a method according to an embodiment of the invention.

FIG. 3 depicts an aspect of a method according to an embodiment of the invention. In determining 108 the transfer condition from at least the first and the second feed-forward requirement data 31, 32, the method includes:

determining 200 a first transfer condition candidate 41 from first feed-forward requirement data 31;

determining 202 a second transfer condition candidate 42 from second feed-forward requirement data 32; and selecting 204 the transfer condition 40 from first transfer condition candidate 41 and second transfer condition candidate 42.

As an example, the first transfer condition candidate may include a high NA and a first focusing height derived from first feed-forward requirement data 31, including a high resolution imaging node and a tight focus control, and the second transfer condition candidate may include a low NA and a second focusing height derived from second feed-forward requirement data 32 including a low resolution imaging node and a wide focus control. Based on the higher NA, the first transfer condition candidate may then be selected as the transfer candidate 40 for imaging this part of the pattern, in order to be able to image the associated device structure with the required resolution and at the required focusing height. The device structure associated with the second feed-forward data may then be imaged at a somewhat less optimal focusing height, but the lower resolution allows such imaging without (significant) sacrificing of the quality of the imaging.

Figure 4:
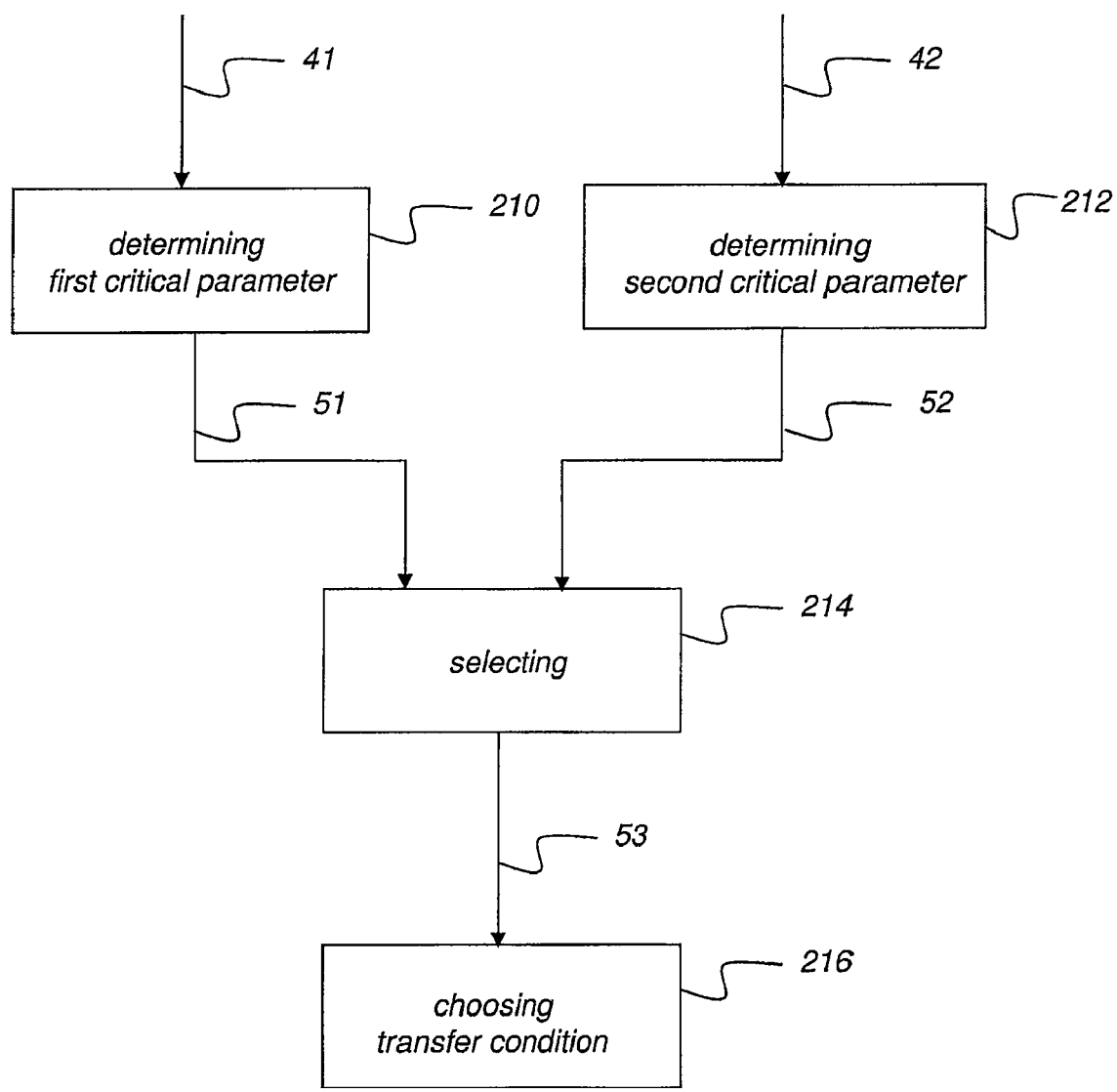
FIG. 4 depicts an aspect of a method according to an embodiment of the invention.

FIG. 4 depicts an aspect of a method according to an embodiment of the invention. In the device manufacturing method, the selecting 204 the transfer condition 40 includes:

determining 210 a first critical parameter 51 associated with first transfer condition candidate 41;

determining 212 a second critical parameter 52 associated with second transfer condition candidate 42;

selecting 214 a most critical parameter 53 from first critical parameter 51 and second critical parameter 52; and choosing 216 as the transfer condition 40 the transfer condition candidate 41, 42 corresponding with most critical parameter 53.

As an example, first transfer condition candidate 41 includes a high NA and a first focusing height derived from the first feed-forward requirement data 31 including a high resolution imaging node and a tight focus control, first critical parameter 51 may be a first depth-of-focus, and second transfer condition candidate 42 includes a low NA and a second focusing height associated with a second critical parameter 52 being a second (and larger) depth-of-focus derived from second feed-forward requirement data 32 including a low resolution imaging node and a wide focus control. Based on a comparison between the first (tight) depth-of-focus and the second (wide) depth-of-focus, the first depth-of-focus will be selected 214 as most critical parameter 53, and the associated first transfer condition candidate 41 may be chosen 216 as transfer candidate 40 for imaging this part of the pattern, in order to image the associated device structure within the depth-of-focus. The device structure associated with the second feed-forward data may then be imaged at a somewhat less optimal focusing height, but the larger second depth-of-focus allows such imaging without (significant) sacrificing of the quality of the imaging.

Figure 5:
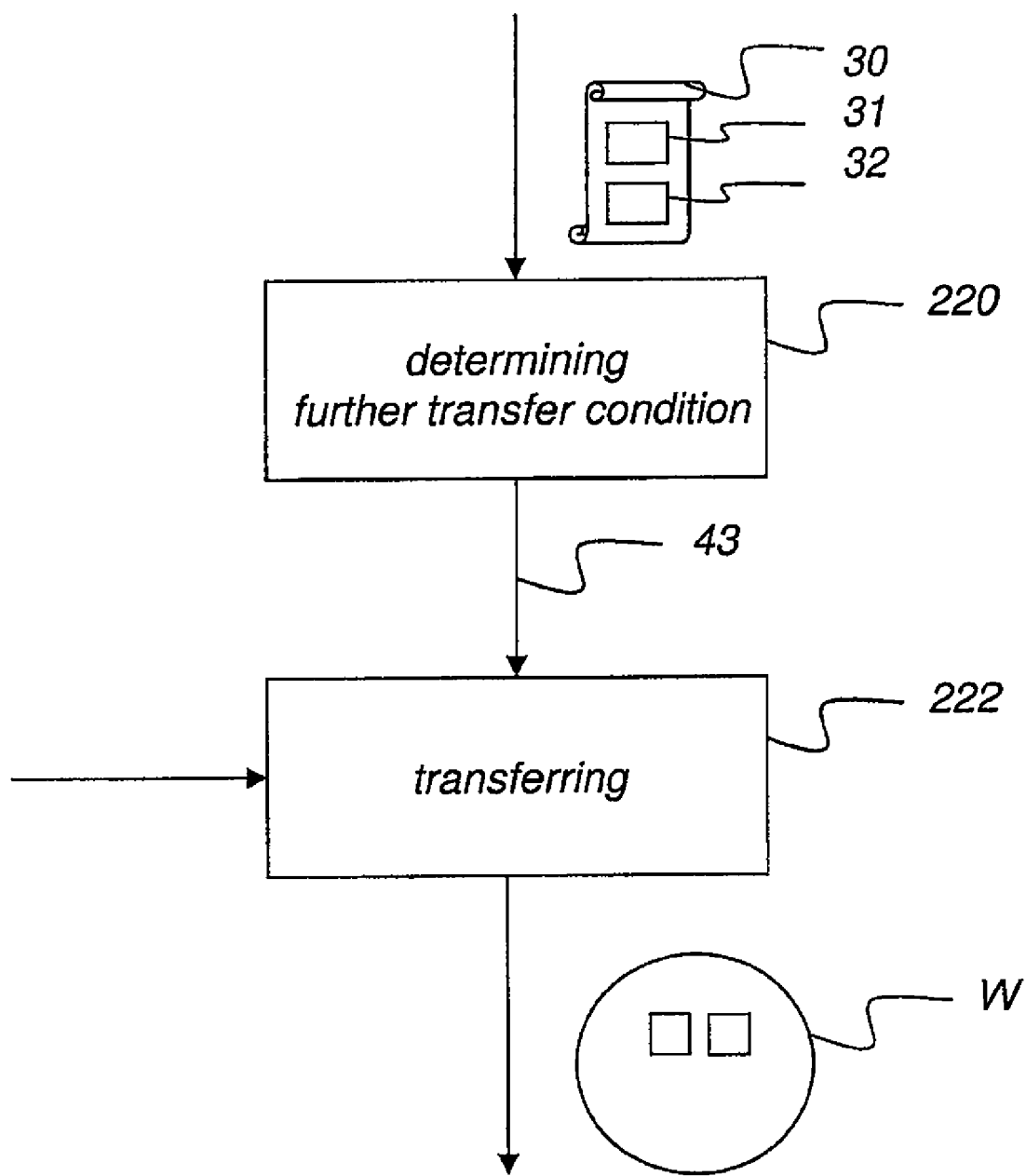
FIG. 5 depicts an aspect of a method according to an embodiment of the invention.

FIG. 5 depicts an aspect of a method according to an embodiment of the invention, and shows:

determining 220 a further transfer condition 43 from at least first and second feed-forward requirement data 31, 32; and transferring 222 a further portion of the pattern from patterning device MA onto substrate W in dependence on further transfer condition 43.

Different portions of the pattern, if not within the same imaging field, may thus be imaged with a different transfer condition.

As an example, when processing a so-called multi-purpose wafer with a variety of different types of devices, a first part of a substrate may be manufactured with devices with high-resolution features and a second part of the substrate may be manufactured with devices with low-resolution features. The first and second part may be associated with different respective first and second feed-forward requirement data, and hence with different transfer conditions, e.g. different NA and focusing heights, different dose and dose control or different overlay requirements.

Figure 6:
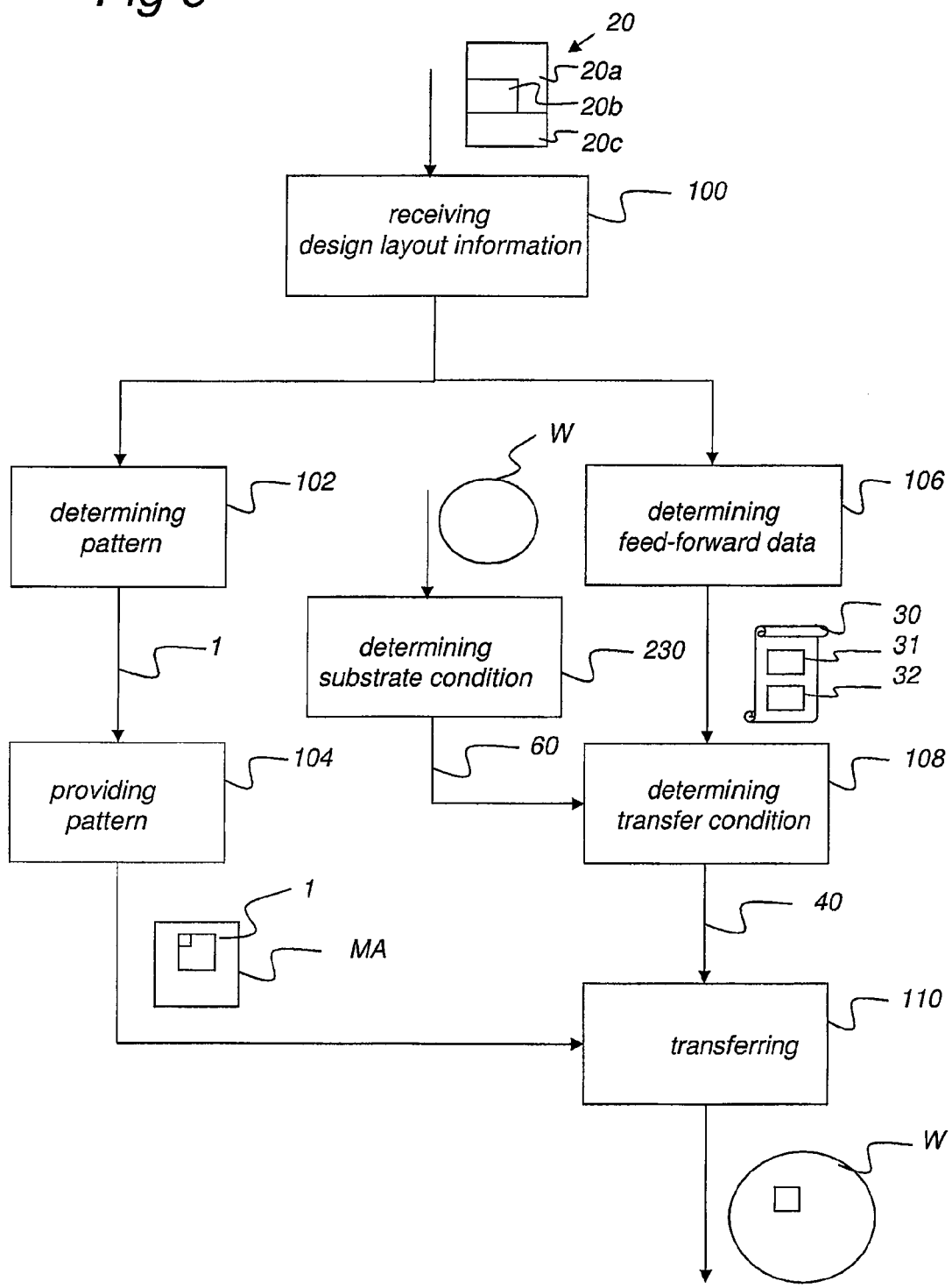
FIG. 6 depicts an aspect of a method according to an embodiment of the invention.

FIG. 6 depicts an aspect of a method according to a further embodiment of the invention. The method shown in FIG. 6 includes the same elements as the method described in reference to FIG. 2, and further includes determining 230 a substrate condition 60 associated with substrate W before transferring the pattern from the patterning device onto the substrate; wherein determining 108 the transfer condition is done from at least first and second feed-forward requirement data 31, 32 and substrate condition 60.

As an example, the substrate may include parts where device features are imaged and the substrate may include parts which remain unimaged. The focus control method may then be different in the boundary region of the substrate compared to the device region, which may have different substrate conditions 60 after one or more layers have been applied on the substrate. For example, when the focusing method uses multiple points within an imaging field to measure the required focusing height and uses a weighted average of the measurements at the multiple points, the weighting of the measurements at the multiple points may be adjusted to achieve an optimal result for the required focusing height to account for differences in reflectivity between the device region and the unimaged region.

Substrate condition 60 may also relate to different physical heights on the substrate. To illustrate this, FIG. 7 schematically depicts a part of an exemplary substrate W used with the lithographic apparatus. The exemplary substrate is shown at a phase during the manufacturing of a IC.

Figure 7A:
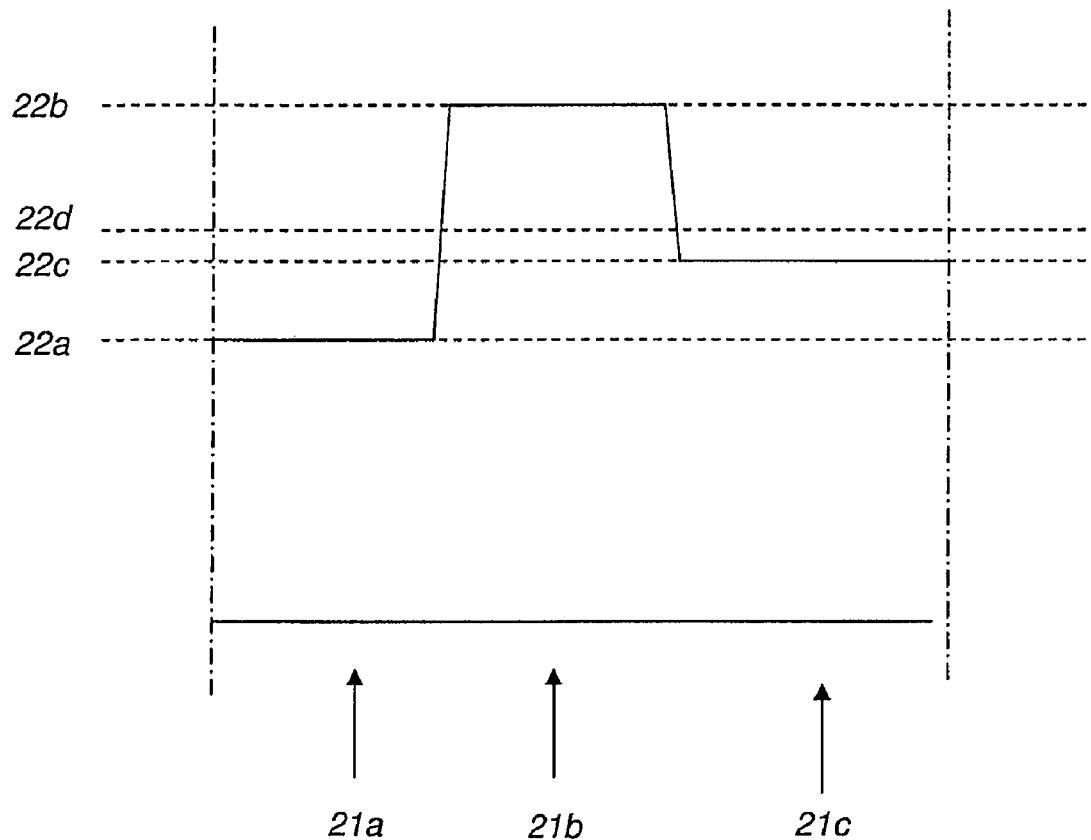
Figure 7B:
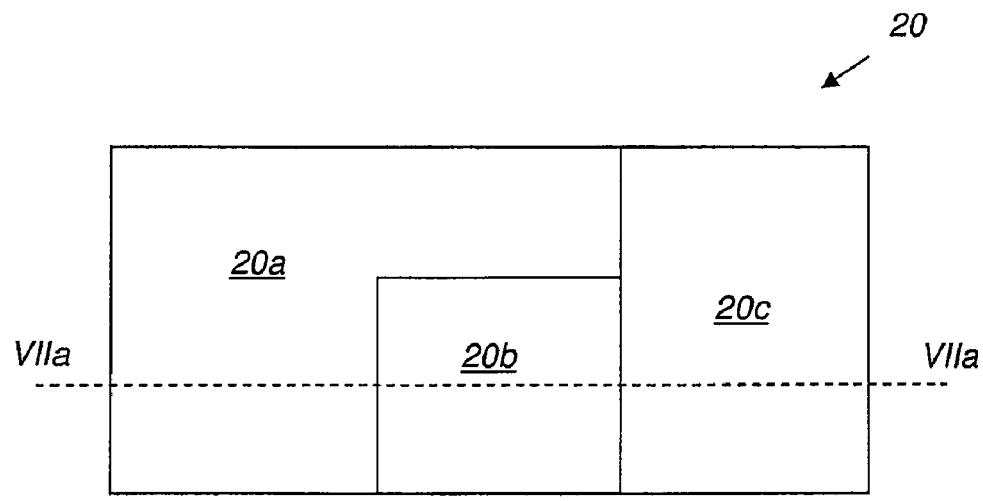

FIG. 7a shows a cross section though the substrate along a line VIIa corresponding to the dashed line in the corresponding device layout information 20 shown in FIG. 7b. The substrate shown has already been processed, wherein the substrate has structure with exemplary elements of a different nature in the three different regions 20a, 20b and 20c.

Exemplary region 20a corresponds to a region of the IC with a low voltage periphery, exposed at a 65 nm imaging node, with a focus control of 140 nm, an overlay control of 20 nm and a dose control of ±10%. Region 20a functionally provides logical elements for operating region 20b, after the device is fully manufactured.

Exemplary region 20b corresponds to a region of the IC with a flash cell area, exposed at a 45 nm imaging node, with a focus control of 70 nm, an overlay control of 10 nm and a dose control of ±5%. Region 20b is a high-resolution region including features with the most critical dimensions on the device. Region 20b functionally provides a memory function, in the form of a flash memory, after the device is fully manufactured.

Exemplary region 20c corresponds to a region of the IC with a high voltage periphery, exposed at a 130 nm imaging node, with a focus control of 400 nm, an overlay control of 40 nm and a dose control of ±20%. Region 20c functionally provides interfacing between the IC and external voltage supply and data lines, after the device is fully manufactured.

At this phase during the manufacturing of the exemplary IC, the IC has undergone several exposures and also several etching and polishing operations. As a result of the different dimensions and density of the structures and different materials of the structures, e.g. different copper-oxide ratios, associated with the different imaging nodes in the different regions 20a, 20b, 20c, the device topography is different in the different regions. In particular, heights 22a, 22b, 22c of the regions on the substrate are different.

In this example, height 22a of low voltage periphery region 21a is the lowest, height 22b of flash cell area 21b is largest, and height 22c of high voltage area 21c is in between the other two. These heights may be measured using the level sensor of the lithographic apparatus.

Imaging is most critical in the flash cell area, where exposure is done at the smallest imaging node and with the tightest requirements. By providing the imaging node for exposure, the focus control requirement, the overlay control requirement and the dose control requirement for each of three areas 20a, 20b, 20c as feed-forward requirement data 30 to the lithographic apparatus, a set of optimal transfer conditions 40 may be derived.

In this example, one optimal transfer condition is the focus height associated with the required focus control. When the different characteristics between the three areas are not taken into account, the focus height would be an average height 22d of heights 22a, 22b, 22c in respective areas 21a, 21b, 21c. When the feed-forward requirement data are taken into account, the substrate can be exposed at the correct height for the most critical area, i.e. height 22b corresponding to the area 21b. As can be seen from the focus control requirements for each of the three regions 20a, 20b, 20c, areas 21a, 21b and 21c may all be exposed with focus height 22b corresponding to the most critical area 21b.

The imaging node information in the feed-forward requirement data may be used to determine as a further optimal transfer condition the NA and the pupil filling associated with the required imaging node Examples of determining other substrate conditions 60 that may be used are, e.g.:

determining 230 the substrate condition 60 includes at least one of:
determining a focus leveling map of substrate W;
performing a leveling measurement on substrate W;

determining an alignment mark position on substrate W;
performing a positioning measurement on substrate W;
determining a position of a structure on substrate W;
determining a boundary of a structure on substrate W.

FIG. 8 depicts an aspect of a method according to an embodiment of the invention. FIG. 8 shows storing 240 the feed-forward requirement data 30, 31, 32 in a feed-forward file 70 for later retrieving 241 the feed-forward requirement data 30, 31, 32 from the feed-forward file 70.

This allows preparation of a transfer of a pattern to the substrate without immediately using the result of the preparatory activities.

Determining 102 the pattern 1 from the design layout information 20, providing 104 the pattern 1 to a patterning device MA and determining 106 feed-forward requirement data 30 from design layout information 20 and storing 240 feed-forward requirement data 30, 31, 32 in a feed-forward file 70 may e.g. be performed for all layers corresponding to the manufacture of a device and corresponding to a plurality of pattern transfers in one turn, after which patterning devices MA are labeled and stored and the associated feed-forward files 70 are labeled and stored. The patterning device MA and the associated feed-forward file 70 may then be retrieved and used one-by-one once the device is actually manufactured and the different layers of the substrate are exposed and processed.

Feed-forward file 70 may also be retrieved for other purposes, such as to gather statistics, e.g. relating to the accumulated dose, or to gather statistics relating to the frequency of using specific imaging nodes.

Feed-forward file 70 may also be retrieved for obtaining information useful for an operator or for a quality test engineer, such as obtaining a position of a test structure for off-line inspection with e.g. a scanning electron microscope (SEM) or an atomic force microscope (AFM), to, e.g. inspect the quality of specific features.

Feed-forward file 70 may also be retrieved for automatically obtaining information useful for off-line, or in-line, inspection with an inspection tool, such as an automatic monitoring of the line width of features with a critical dimension.

FIG. 9 depicts an aspect of a method according to an embodiment of the invention. FIG. 9 shows offering 250 at least part of feed-forward requirement data 30, 31, 32 in a human-readable manner 251.

This may e.g. be presented as a human-readable text document or a diagram.

The associated feed-forward requirement data may be specifically provided for use by a human, e.g. the quality test engineer, e.g. to provide the engineer with the position of the test structure for off-line inspection.

FIG. 10 depicts an aspect of a method according to an embodiment of the invention. FIG. 10 further details regarding transferring 110 the portion of the pattern from the patterning device MA onto the substrate W, which includes, in an embodiment:
providing 260 a radiation beam B;
conditioning 262 radiation beam B with a radiation beam condition 80;
positioning 264 patterning device MA relative to substrate W with a position condition 82;
forming 266 a patterned radiation beam BP by imparting radiation beam B with radiation beam condition 80 with pattern 1 in its cross-section;
conditioning 268 patterned radiation beam BP with a projection beam condition 84; and
projecting 270 patterned radiation beam BP onto a target portion of substrate W with projection beam condition 84;

wherein transfer condition 40 includes at least one condition selected from the group consisting of radiation beam condition 80, projection beam condition 84 and position condition 82.

As an example, transfer condition 40 may e.g. include a dose of the radiation beam, a magnification of the projection beam and an alignment between the patterning device and the substrate with first positioner PM and/or second positioner PW.

As another example, transfer condition 40 may e.g. include an adjustment of the radiation beam using adjustable optics, applying as wavefront sensing structure to form the patterned beam, and the use of an interferometric measurement system to determine the optical quality of the beam.

Feed-forward requirement data 30 may include information associated with at least one condition selected from the group consisting of
the condition of radiation beam B during projection of the patterned radiation beam onto the target portion of the substrate,
a dose condition of radiation beam B during projection of the patterned radiation beam onto the target portion of the substrate,
an imaging node of projection beam BP during projection of the patterned radiation beam onto the target portion of the substrate,
a numerical aperture condition of radiation beam B during projection of the patterned radiation beam onto the target portion of the substrate,
a pupil filling condition of radiation beam B during projection of the patterned radiation beam onto the target portion of the substrate, and
a radiation beam distortion of radiation beam B during projection of the patterned radiation beam onto the target portion of the substrate.

As an example, for a so-called scanner, the radiation beam may be shaped with a slit in the radiation beam with a dose distribution over the slit, and each target portion may be irradiated by scanning the pattern through the shaped radiation beam in a given direction (the "scanning"-direction) while synchronously scanning the substrate parallel or anti-parallel to this direction, in a so-called single dynamic exposure. The feed-forward requirement data may include a dose condition telling which dose control is required for which area in the reticle, and hence defines what areas in the reticle need most critical dose control. Based on this the scanner may, in determining the transfer condition, re-optimize the slit dose uniformity so that these areas are exposed with least intensity variation across the slit (at the expense of areas where a less accurate dose control is needed). Likewise, in the scanning-direction, when exposing areas where most accurate control is necessary, a slower scan speed may be used and in less critical areas, a faster scan speed may be used. Depending on the uniformity requirements as given in the feed-forward requirement data, the scanner may determine as a transfer condition the velocity and direction of substrate table WT relative to mask table MT.

Feed-forward requirement data 30 may include information associated with at least one condition selected from the group consisting of
the condition of projection beam BP during projection of the patterned radiation beam onto the target portion of the substrate, a focus condition of projection beam BP during projection of the patterned radiation beam onto the target portion of the substrate, an overlay condition of projection beam BP during projection of the patterned radiation beam onto the target portion of the substrate, a numerical aperture condition of projection beam BP during projection of the patterned radiation beam onto the target portion of the substrate, a pupil filling condition of projection beam BP during projection of the patterned radiation beam onto the target portion of the substrate, a projection beam distortion of projection beam BP during projection of the patterned radiation beam onto the target portion of the substrate, a metrology control condition of projection beam BP, and a further control condition of projection beam BP during projection of the patterned radiation beam onto the target portion of the substrate, the further control condition obtainable from a metrology instrument MI; MO.

Feed-forward requirement data 30 may include information associated with at least one condition selected from the group consisting of a position of a test structure P3 (FIG. 11) on substrate W;
a position of an alignment mark P1, P2 on substrate W;
a position of a wavefront sensing structure P4 on substrate W;
a position of an inspection area P5 on substrate W.

FIGS. 11 and 12 depict an aspect of a method according to an embodiment of the invention, showing that feed-forward requirement data 30 may include information associated with the position of inspection area P5 on the substrate, and the method further including inspecting 280 inspection area P5 on the substrate with an inspection tool 282 to obtain an inspection result 284.

As described above, feed-forward data 30 may also be used, e.g. to supply an operator or a quality test engineer with e.g. a position of a test structure for off-line inspection with e.g. a scanning electron microscope (SEM) or an atomic force microscope (AFM), to, e.g. inspect the quality of specific features.

Feed-forward data 30 may also be used for automatically obtaining information useful for off-line, or in-line, inspection with an inspection tool, such as an automatic monitoring of the line width of features with a critical dimension.

Determining 108 the transfer condition from at least the first and the second feed-forward requirement data may be further performed in dependence of inspection result 284.

E.g., when inspection may indicate that the imaged line width is smaller than intended, a correction may be made to the dose of the beam or a tighter dose control may be used by using a different combination of beam intensity and exposure time.

Figure 13A:
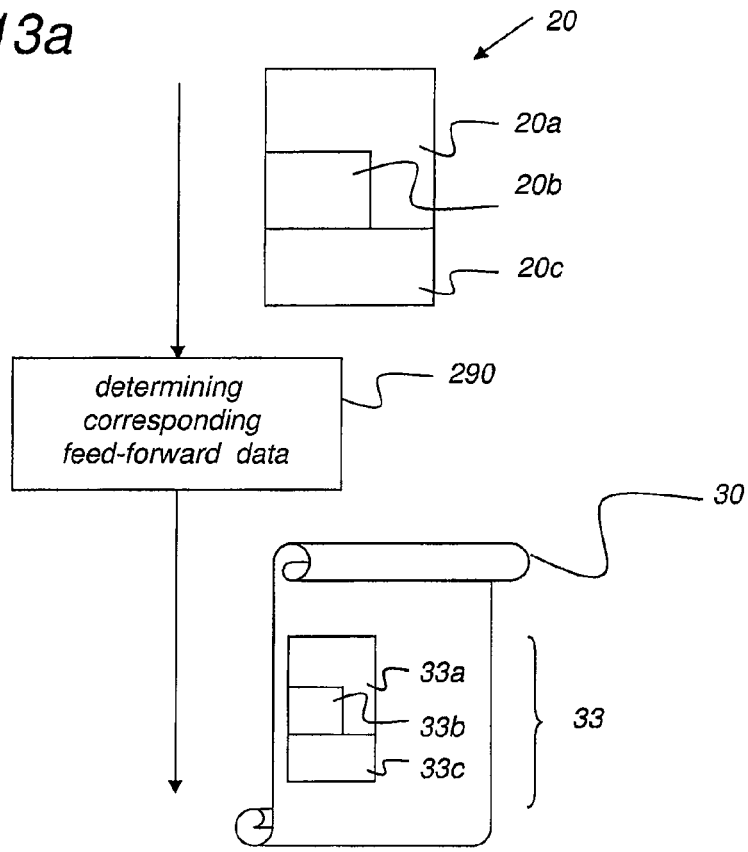
Figure 13B:
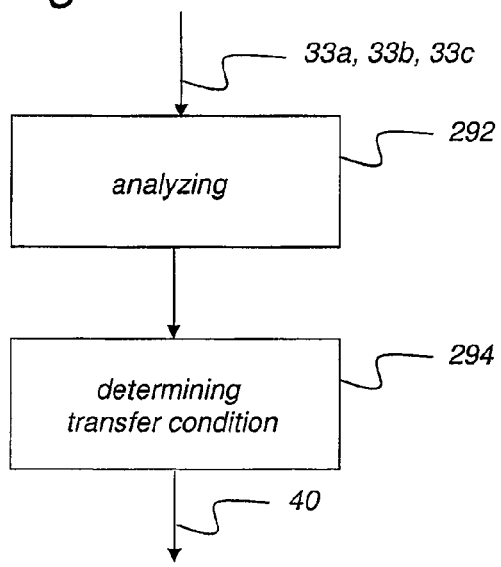
Figure 13C:
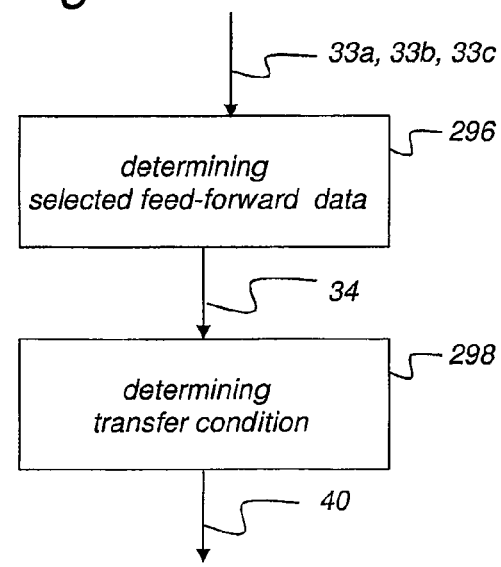

FIGS. 13a-13c depict aspects of a method according to an embodiment of the invention wherein:

determining 106 feed-forward requirement data 30 includes determining 290 for a plurality of parts 1a, 1b, 1c of the pattern corresponding intra-pattern feed-forward requirement data 33a, 33b, 33c; and determining 108 transfer condition 40 in dependence on at least the feed-forward requirement data 30 includes analyzing 292 the plurality of intra-pattern feed-forward requirement data 33a, 33b, 33c, and determining 294 transfer condition 40 from the plurality of intra-pattern feed-forward requirement data 33a, 33b, 33c.

E.g., within a single imaging field, parts of the pattern may include features of a critical dimension and larger features. The transfer condition is then determined such that both feature types are imaged with sufficient quality.

As shown in FIG. 13c, determining 294 the transfer condition 40 from the plurality of intra-pattern feed-forward requirement 33 data may include determining 296 a selected intra-pattern feed-forward requirement data 34 from the plurality of the intra-pattern feed-forward requirement data 33a, 33b, 33c in dependence on analysis 292, and determining 298 the transfer condition in dependence on the selected intra-pattern feed-forward requirement data 34.

E.g., the transfer condition associated with the features with the highest resolution or the tightest overlay requirements may be selected.

FIG. 14 depicts an aspect of a method according to an embodiment of the invention wherein:

determining 102 the pattern 1 from design layout information 20 includes determining 300 a plurality of patterns for a plurality of corresponding locations on patterning device MA from design layout information 20;

providing 104 the pattern to a patterning device includes providing 302 at least part of the plurality of patterns to the corresponding locations on the patterning device; and determining 106 the feed-forward requirement data includes determining 304 for the plurality of patterns on different locations on the patterning device corresponding inter-pattern feed-forward requirement data 35, 35a, 35b from the design layout information 20; and providing 306 the plurality of the inter-pattern feed-forward requirement data 35 to feed-forward requirement data 30.

E.g., design layout information related to different imaging fields corresponding to different locations on the substrate, e.g. spaced at a large distance, may result in different feed-forward requirement data, especially when a variety of different device structures is manufactured on a single wafer. Feed-forward requirement data 35a, 35b corresponding to each position within the design layout information or on the substrate (including added test structures) may then be provided in feed-forward requirement data 30 as e.g. stored in feed-forward file 70.

The lithographic system according to an embodiment of the invention is arranged and construed for:

receiving 100 a design layout information 20 associated with a device 10;

determining 102 a pattern 1 from design layout information 20;

determining 106 feed-forward requirement data 30 from design layout information 20, wherein the feed-forward requirement data includes at least first feed-forward requirement data 31 related to a first location in the pattern and second feed-forward requirement data 32 related to a second location in the pattern;

providing 104 the pattern to a patterning device MA;

determining 108 a transfer condition 40 from at least first and second feed-forward requirement data 31, 32; and transferring 110 a portion of pattern 1 from patterning device MA onto a substrate W in dependence on transfer condition 40.

FIG. 15 depicts a lithographic system according to an embodiment of the invention. FIG. 15 shows the lithographic system including a lithographic apparatus 1000 and a design for manufacturing system 1002, wherein the design for manufacturing system 1002 is arranged and construed for:

the receiving 100 the design layout information;

the determining 102 the pattern from the design layout information;

the determining 106 the feed-forward requirement data from the design layout information; and the providing 104 the pattern to the patterning device; and the lithographic apparatus 1000 is arranged and construed for:

receiving 400 the feed-forward requirement data from the design for manufacturing system, receiving 402 the patterning device from the design for manufacturing system;

the determining 108 the transfer condition from at least the first and the second feed-forward requirement data; and the transferring 110 the portion of pattern from the patterning device onto the substrate in dependence on the transfer condition.

For determining 108 the transfer condition from at least first and second feed-forward requirement data 31, 32, the lithographic system may be arranged and construed for:

determining 200 a first transfer condition candidate from the first feed-forward requirement data;

determining 202 a second transfer condition candidate from the second feed-forward requirement data; and selecting 204 the transfer condition from the first transfer condition candidate and the second transfer condition candidate.

For selecting 204 the transfer condition, the lithographic system may be arranged and construed for:

determining 210 a first critical parameter associated with the first transfer condition candidate;

determining 212 a second critical parameter associated with the second transfer condition candidate;

selecting 214 a most critical parameter from the first critical parameter and the second critical parameter; and choosing 216 the transfer condition candidate corresponding with the most critical parameter.

The lithographic system may be further arranged and construed for:

determining 220 a further transfer condition from at least the first and the second feed-forward requirement data; and transferring 222 a further portion of the pattern from the patterning device onto the substrate in dependence on the further transfer condition.

A lithographic apparatus according to an embodiment of the invention includes:

an illumination system IL configured to condition a radiation beam B with a radiation beam condition 80; a support MT constructed to support a patterning device MA, the patterning device being capable of imparting radiation beam B with a pattern 1 in its cross-section to form a patterned radiation beam; a projection system PS configured to project the patterned radiation beam onto a target portion of a substrate W with a projection beam condition 84; a positioner PM, PW configured to position the patterning device MA relative to substrate W with a position condition 82; and a controller CT configured to control at least one condition selected from the group consisting of radiation beam condition 80, projection beam condition 84 and position condition 82 with at least a transfer condition;

wherein controller CT is configured for:

receiving 400 feed-forward requirement data, the feed-forward requirement data being associated with the pattern of the patterning device and including at least first feed-forward requirement data related to a first location in the pattern and second feed-forward requirement data related to a second location in the pattern; and determining 108 the transfer condition from at least the feed-forward requirement data.

For determining 108 the transfer condition from the feed-forward requirement data, controller CT may be configured for:

determining 200 a first transfer condition candidate from the first feed-forward requirement data;

determining 202 a second transfer condition candidate from the second feed-forward requirement data; and selecting 204 the transfer condition from the first transfer condition candidate and the second transfer condition candidate.

For selecting 204 the transfer condition, controller CT may be configured for:

determining 210 a first critical parameter associated with the first transfer condition candidate;

determining 212 a second critical parameter associated with the second transfer condition candidate;

selecting 214 a most critical parameter from the first critical parameter and the second critical parameter; and choosing 216 the transfer condition candidate corresponding with the most critical parameter.

Controller CT may be configured for determining 220 a further transfer condition from at least the first and the second feed-forward requirement data; and the lithographic system may be further arranged and construed for transferring 222 a second portion of the pattern from the patterning device onto the substrate in dependence on the further transfer condition.

Controller CT may be configured, in order to determine the transfer condition, for:

determining 230 a substrate condition associated with the substrate before transferring the pattern from the patterning device onto the substrate; and determining 108 the transfer condition may be performed from at least the feed-forward requirement data and the substrate condition.

The lithographic apparatus may determine the substrate condition in cooperation with at least one of:

a level sensor 1010 arranged for at least one of:
  determining a focus leveling map of the substrate, and
  performing a leveling measurement on the substrate; and a positioning sensor 1012 arranged for at least one of:
  determining an alignment mark position;
  performing a positioning measurement on the substrate;
  determining a position of a structure on the substrate; and
  determining a boundary of a structure on the substrate; and an alignment sensor 1014.

Figure 16A:
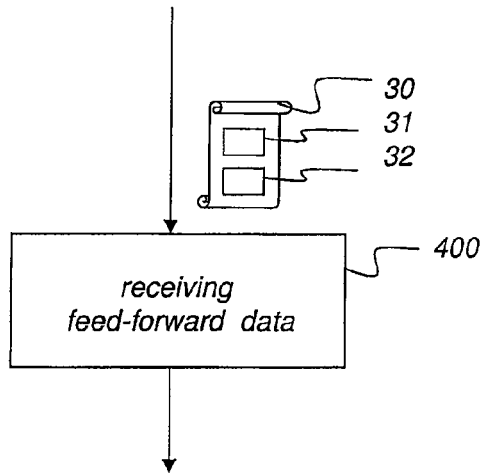
Figure 16B:
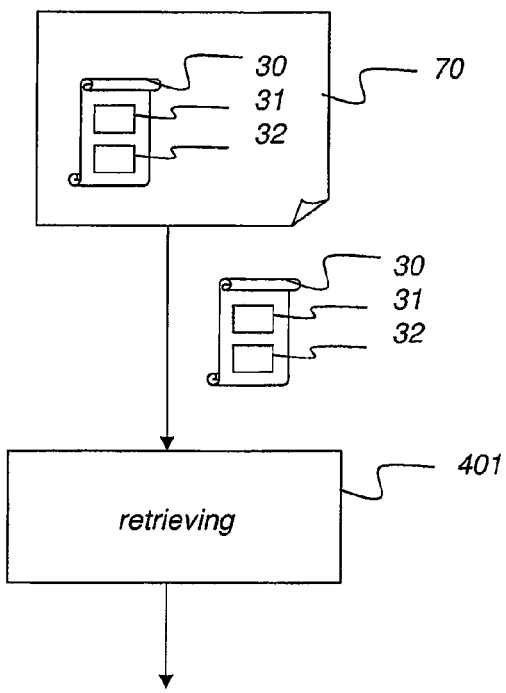

FIGS. 16a-16b depict an aspect of an embodiment of a controller in a lithographic apparatus according to the invention.

FIG. 16a, in conjunction with FIG. 15, shows a controller CT configured for receiving 400 the feed-forward requirement data from a design for manufacturing system 1002.

FIG. 16b, in conjunction with FIG. 15, shows a controller CT configured for retrieving 401 the feed-forward requirement data 30 from a feed-forward file 70.

Figure 16C:
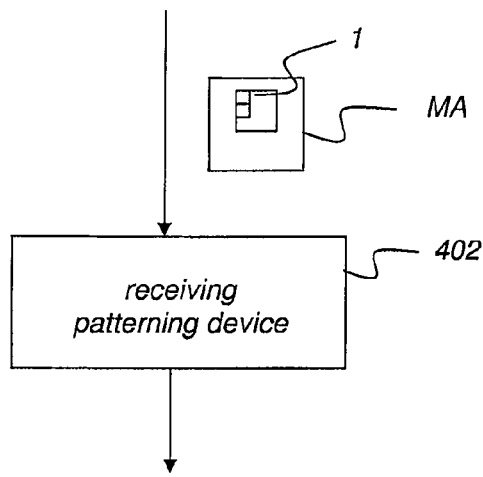

FIG. 16c depicts, in conjunction with FIG. 15, an aspect of an embodiment of a lithographic apparatus according to the invention. The lithographic apparatus is further configured for receiving 402 patterning device MA from the design for manufacturing system 1002.

Embodiments of the invention provide a design for manufacturing system 1002 that includes a processor 2000 (FIG. 15), the processor 2000 being configured to:
- receive 100 a design layout information 20 associated with a device; and
- determine 106 feed-forward requirement data 30 from the design layout information, the feed-forward requirement data being suitable to be provided to a lithographic apparatus 1000.

FIG. 15 depicts an embodiment of the design for manufacturing system according to the invention.

The design for manufacturing system may be further configured to store 240 the feed-forward requirement data 30 in a feed-forward file 70, the feed-forward file being readable by lithographic apparatus 1000.

The design for manufacturing system may be further configured to offer 250 at least part of the feed-forward requirement data in a human-readable manner.

The processor 2000 may be further configured to determine 102 the pattern from the design layout information; and the design for manufacturing system may further include a patterning device writer 1004 configured to provide 104 the pattern to a patterning device, the patterning device being suitable to be provided to the lithographic apparatus.

The processor 2000 may be configured, in order to determine 106 the feed-forward requirement data from the design layout information, to:
- determine 290 for a plurality of parts 2 of the pattern corresponding intra-pattern feed-forward requirement data 33; and
- provide the plurality of intra-pattern feed-forward requirement data to the feed-forward requirement data.

The processor 2000 may be configured, in order to determine 106 the feed-forward requirement data from the design layout information, to:
- determine 300 a plurality of patterns for a plurality of corresponding locations on patterning device MA from design layout information 20;
- determine 304 for the plurality of patterns on different locations on the patterning device corresponding inter-pattern feed-forward requirement data 35 from design layout information 20; and
- provide 306 the plurality of the inter-pattern feed-forward requirement data 35 to feed-forward requirement data 30.

The patterning device writer may be configured, in order to provide the pattern to a patterning device, to:
- provide 302 at least part of the plurality of patterns to the corresponding location on the patterning device.

An embodiment of the invention provides a lithographic apparatus 1000 arranged to transfer with a transfer condition 40 a pattern 1 from a patterning device MA onto a substrate W, wherein
the lithographic apparatus is configured to receive 400 feed-forward requirement data 30, the feed-forward requirement data being associated with the pattern from the patterning device; and determine 108 transfer condition 40 from feed-forward requirement data 30.

An embodiment of the invention provides a computer program product including instructions and data to allow a processor CT, 2000 to run a predetermined program in accordance with any one of the methods as described above.

According to an aspect of the invention, there is provided a computer program product on a medium readable by a processor, the processor being associated with a lithographic apparatus arranged and construed for transferring a pattern from a patterning device onto a substrate in dependence on a transfer condition, the computer program, when loaded in the processor, causing the processor to perform a method including:
- receiving feed-forward requirement data, the feed-forward requirement data being associated with the pattern of the patterning device and including at least first feed-forward requirement data related to a first location in the pattern and second feed-forward requirement data related to a second location in the pattern; and
- determining the transfer condition from at least feed-forward requirement data.

According to an aspect of the invention, there is provided a computer program product on a medium readable by a processor, the processor being associated with design for manufacturing system arranged and construed for providing a pattern for a patterning device and feed-forward requirement data usable in a lithographic apparatus being arranged and construed transferring the pattern from the patterning device onto a substrate in dependence on a transfer condition determined from the feed-forward requirement data, and the computer program, when loaded in the processor, causing the processor to perform a method including:
- receiving a design layout information associated with a device;
- determining the feed-forward requirement data from the design layout information, the feed-forward requirement data being suitable to be provided to a lithographic apparatus.

According to an aspect of the invention, there is provided a computer-readable medium being provided with such a computer program.

According to an aspect of the invention, there is provided a computer-readable medium being provided with a feed-forward file, the feed-forward file including feed-forward requirement data, wherein the feed-forward requirement data includes at least first feed-forward requirement data related to a first location in the pattern and second feed-forward requirement data related to a second location in the pattern and the feed-forward requirement data is usable for determining a transfer condition.

According to an aspect of the invention, there is provided a computer-readable medium being provided with such a computer program.

According to an aspect of the invention, there is provided a computer-readable medium being provided with a feed-forward file 70, the feed-forward file including feed-forward requirement data 30, wherein the feed-forward requirement data includes at least first feed-forward requirement data 31 related to a first location in the pattern and second feed-forward requirement data 32 related to a second location in the pattern and feed-forward requirement data 30 is usable for determining a transfer condition 40.

In FIG. 17, an overview is given of an exemplary computer arrangement that can be used to carry out the method according to the invention. The exemplary arrangement includes a processor 601 for carrying out arithmetic operations.

Processor 601 is connected to a plurality of memory components, including a hard disk 605, Read Only Memory (ROM) 607, Electrically Erasable Programmable Read Only Memory (EEPROM) 609, and Random Access Memory (RAM) 611. Not all of these memory types need necessarily be provided. Moreover, these memory components need not be located physically close to processor 601 but may be located remotely from processor 601.

Processor 601 is also connected to an input device for inputting instructions, data etc. by a user, such as a keyboard 613, and a mouse 615. Other input devices, such as a touch screen, a track ball and/or a voice converter, known to persons skilled in the art may be provided too.

A reading unit 617 connected to processor 601 is provided. Reading unit 617 is arranged to read data from and possibly write data on a data carrier such as a floppy disk 619 or a CD 621. Other data carriers may be tapes, DVD, BD, etc. as is known to persons skilled in the art.

Processor 601 is also connected to a printer 623 for printing output data on paper, as well as to a display 603, for instance, a cathode-ray tube monitor or a LCD (Liquid Crystal Display) screen, or any other type of display known to persons skilled in the art.

Processor 601 may be connected to a communication network 627, for instance, the Public Switched Telephone Network (PSTN), a Local Area Network (LAN), a Wide Area Network (WAN), etc. by way of I/O device 625. Processor 601 may be arranged to communicate with other communication arrangements through network 627.

Data carrier 619, 621 may include a computer program product in the form of data and instructions arranged to provide the processor with the capacity to perform a method in accordance with the invention. However, such computer program product may, alternatively, be downloaded via the telecommunication network 627.

Processor 601 may be implemented as a stand alone system, or as a plurality of parallel operating processors each arranged to carry out subtasks of a larger computer program, or as one or more main processors with several sub-processors. Parts of the functionality of the invention may even be carried out by remote processors communicating with processor 601 through network 627.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A device manufacturing method for transferring a pattern from a patterning device onto a substrate, the method comprising:
   receiving design layout information associated with a device;
   determining a pattern from the design layout information;
   providing the pattern to a patterning device;
   determining feed-forward requirement data from the design layout information, wherein the feed-forward requirement data comprises at least first feed-forward requirement data related to a first location in the pattern and second feed-forward requirement data related to a second location in the pattern;

determining a transfer condition from at least the first and the second feed-forward requirement data; and transferring a portion of the pattern from the patterning device onto the substrate in dependence on the transfer condition.

2. The device manufacturing method according to claim 1, wherein determining the transfer condition from at least the first and the second feed-forward requirement data comprises:

determining a first transfer condition candidate from the first feed-forward requirement data;

determining a second transfer condition candidate from the second feed-forward requirement data; and selecting the transfer condition from the first transfer condition candidate and the second transfer condition candidate.

3. The device manufacturing method according to claim 2, wherein selecting the transfer condition comprises:

determining a first critical parameter associated with the first transfer condition candidate;

determining a second critical parameter associated with the second transfer condition candidate;

selecting a most critical parameter from the first critical parameter and the second critical parameter; and choosing as the transfer condition the transfer condition candidate corresponding with the most critical parameter.

4. The device manufacturing method according to claim 1, further comprising:

determining a further transfer condition from at least the first and the second feed-forward requirement data; and transferring a further portion of the pattern from the patterning device onto the substrate based, at least in part, on the further transfer condition.

5. The device manufacturing method according to claim 1, further comprising:

determining a substrate condition associated with the substrate before transferring the pattern from the patterning device onto the substrate; and wherein determining the transfer condition is based upon at least the first and second feed-forward requirement data and the substrate condition.

6. The device manufacturing method according to claim 5, wherein determining the substrate condition comprises at least one of:

determining a focus leveling map of the substrate;

performing a leveling measurement on the substrate;

determining an alignment mark position;

performing a positioning measurement on the substrate;

determining a position of a first structure on the substrate; and determining a boundary of a second structure on the substrate.

7. The device manufacturing method according to claim 1, further comprising:

storing the feed-forward requirement data in a feed-forward file for later retrieval of the feed-forward requirement data from the feed-forward file.

8. A computer program product on a medium readable by a processor, the processor being associated with a design for manufacturing system arranged and configured for providing a pattern for a patterning device and feed-forward requirement data usable in a lithographic apparatus, and the computer program, when loaded in the processor, causing the processor to perform a method comprising:

receiving a design layout information associated with a device;

determining the feed-forward requirement data from the design layout information;

determining a transfer condition from the feed-forward requirement data; and transferring a portion of the pattern from the patterning device onto the substrate in dependence on the transfer condition.

9. The computer program product according to claim 8, further comprising instructions, which when loaded in the processor, cause the processor to perform:

storing the feed-forward requirement data in a feed-forward file, the feed-forward file being readable by the lithographic apparatus.

10. The computer program product according to claim 8, further comprising instructions, which when loaded in the processor, cause the processor to perform:

displaying at least part of the feed-forward requirement data in a human-readable manner.

11. The computer program product according to claim 8, further comprising instructions, which when loaded in the processor, cause the processor to perform:

determining the pattern from the design layout information.

12. The computer program product according to claim 8, wherein the determining the feed-forward requirement data from the design layout information includes:

determining for a plurality of parts of the pattern corresponding intra-pattern feed-forward requirement data; and providing the plurality of intra-pattern feed-forward requirement data to the feed-forward requirement data.

13. The computer program product according to claim 8, wherein the determining, the feed-forward requirement data from the design layout information includes:

determining a plurality of patterns for a plurality of corresponding locations on the patterning device from the design layout information;

determining for the plurality of patterns on different locations on the patterning device corresponding inter-pattern feed-forward requirement data from the design layout information; and providing the plurality of the inter-pattern feed-forward requirement data to the feed-forward requirement data.

* * * * *